(12) United States Patent
Akimoto

(10) Patent No.: US 8,158,975 B2
(45) Date of Patent: Apr. 17, 2012

(54) SEMICONDUCTOR DEVICE AND MANUFACTURING METHOD THEREOF

(75) Inventor: Kengo Akimoto, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 52 days.

(21) Appl. No.: 12/575,564

(22) Filed: Oct. 8, 2009

(65) Prior Publication Data

US 2010/0090217 A1    Apr. 15, 2010

(30) Foreign Application Priority Data

Oct. 10, 2008   (JP) .................... 2008-264497

(51) Int. Cl.
H01L 29/10 (2006.01)
H01L 29/12 (2006.01)
H01L 21/00 (2006.01)
H01L 21/16 (2006.01)

(52) U.S. Cl. ............ 257/43; 257/E21.46; 438/104
(58) Field of Classification Search .......... 257/43, 257/E21.46; 438/104
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,847,410 A | 12/1998 | Nakajima | |
| 6,294,274 B1 | 9/2001 | Kawazoe et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

EP            1737044 A         12/2006
(Continued)

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(Continued)

Primary Examiner — Kiesha Bryant
Assistant Examiner — Igwe U Anya
(74) Attorney, Agent, or Firm — Eric J. Robinson; Robinson Intellectual Property Law Office, P.C.

(57) ABSTRACT

Electric characteristics and reliability of a thin film transistor are impaired by diffusion of an impurity element into a channel region. The present invention provides a thin film transistor in which aluminum atoms are unlikely to be diffused to an oxide semiconductor layer. A thin film transistor including an oxide semiconductor layer including indium, gallium, and zinc includes source or drain electrode layers in which first conductive layers including aluminum as a main component and second conductive layers including a high-melting-point metal material are stacked. An oxide semiconductor layer 113 is in contact with the second conductive layers and barrier layers including aluminum oxide as a main component, whereby diffusion of aluminum atoms to the oxide semiconductor layer is suppressed.

16 Claims, 23 Drawing Sheets

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1* | 5/2007 | Akimoto ............... 257/61 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1* | 10/2007 | Kim et al. ............ 257/43 |
| 2007/0252928 A1 | 11/2007 | Ito et al. |
| 2007/0254456 A1* | 11/2007 | Maruyama et al. ....... 438/458 |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1* | 9/2008 | Park et al. ............ 257/43 |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0072122 A1* | 3/2009 | Tada et al. .............. 250/208.1 |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025678 A1 | 2/2010 | Yamazaki et al. |
| 2010/0065838 A1* | 3/2010 | Yamazaki et al. ........... 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |

FOREIGN PATENT DOCUMENTS

| | | |
|---|---|---|
| EP | 1 770 788 | 4/2007 |
| EP | 1 995 787 | 11/2008 |
| EP | 1 998 373 | 12/2008 |
| EP | 1 998 374 | 12/2008 |
| EP | 1 998 375 | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 08339974 A * | 12/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2007-250983 A | 9/2007 |
| WO | WO-2004/114391 | 12/2004 |
| WO | WO-2007/119386 | 10/2007 |

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$-$Ga_2ZnO_4$-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$(m = 3, 4, and 5), $InGaO_3(ZnO)_3$, and Ga$_2$O$_3$(ZnO)$_m$(m = 7, 8, 9, and 16) in the In$_2$O$_3$-ZnGa$_2$O$_4$-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Osada.T et al., "15.2: Development of Driver-Integrated Panel using Amorphous In-Ga-Oxide TFT,", SID Digest '09 : SID International Symposium Digest of Technical Papers, May 31, 2009, pp. 184-187.

Li.C et al., "Modulated Structures of Homologous Compounds InMO$_3$(ZnO)$_m$(M=In,Ga; m=Integer) Described by Four-Dimensional Superspace Group,", Journal of Solid State Chemistry, 1998, vol. 139, pp. 347-355.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, pp. 899-902.

Kanno.H et al., "White Stacked Electrophosphorecent Organic Light-Emitting Device Employing MoO$_3$as a Change-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZnO TFT,", IMID '07 Digest, 2007, p. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 281-287.

Miyasaka.M, "58.2 Invited Paper : Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, 2009, pp. 395-398.

Lee.H et al., "Current Status of, Challenges To, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe$_2$O$_4$, and Yb$_2$Fe$_3$O$_7$ Types Structures for Compounds in the In$_2$O$_3$ and Sc$_2$O$_3$-A$_2$O$_3$-BO Systems [A: Fe, Ga, or Al; B: Mg, Mn, Fe, Ni, Cu, or Zn] AT Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park et al., "Improvements in the device characteristics of amorphous indium gallium zinc oxide thin-film transistors by Ar plasma treatment," Appl. Phys. Lett., vol. 90, pp. 262106-1-262106-3, 2007.

Jeong et al., "High performance thin film transistors with cosputtered amorphous indium gallium zinc oxide channel," Appl. Phys. Lett., vol. 91, pp. 113505-1-113505-3, 2007.

Kimura et al., "Trap densities in amorphous-InGaZnO$_4$thin-film transistors," Appl. Phys. Lett., vol. 92, pp. 133512-1-133512-3, 2008.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Fortunato.E et al., "Wide-Bandgap High-Mobility Zno Thin-Film Transistors Produced at Room Temperature,", Appl. Phys. Lett. (Applied Physics Letters) , Sep. 27, 2004, vol. 85, No. 13, pp. 2541-2543.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Ueno.K et al., "Field-Effect Transistor on SrTiO3 With Sputtered Al2O3 Gate Insulator,", Appl. Phys. Lett.(Applied Physics Letters), Sep. 1, 2003, vol. 83, No. 9, pp. 1755-1757.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

* cited by examiner

SEMICONDUCTOR DEVICE AND MANUFACTURING METHOD THEREOF

BACKGROUND OF THE INVENTION

1. Field of the Invention

An embodiment of the present invention relates to a semiconductor device having a circuit including a thin film transistor (hereinafter referred to as a TFT) in which an oxide semiconductor film is used for a channel formation region, and a manufacturing method thereof. For example, the present invention relates to an electronic appliance on which an electro-optical device typified by a liquid crystal display panel or a light-emitting display device having an organic light-emitting element is mounted as a component. It is to be noted that the semiconductor devices in this specification indicate all the devices which can operate by using semiconductor characteristics, and an electro-optical device, a semiconductor circuit, and an electronic appliance are all included in the semiconductor devices.

2. Description of the Related Art

Recently, active-matrix display devices (such as liquid crystal display devices, light-emitting display devices, and electrophoretic display devices) in each of which a switching element of a thin film transistor (TFT) is provided in each display pixel arranged in matrix, have been actively developed. Since a switching element is provided in each pixel (or each dot), the active-matrix display devices are advantageous in low voltage driving in the case of increasing the pixel density as compared to a passive matrix mode.

A technique for manufacturing a thin film transistor (TFT) or the like using an oxide semiconductor film for a channel formation region and applying it to an electronic device or an optical device has been attracting attention. As examples of such a thin film transistor, a thin film transistor using ZnO for an oxide semiconductor film and a thin film transistor using oxide including indium, gallium, and zinc for an oxide semiconductor film can be given, for example. A technique for forming such a thin film transistor using an oxide semiconductor film over a light-transmitting substrate and applying it to a switching element or the like of an image display device is disclosed in Patent Document 1, Patent Document 2, and the like.

Further, a variety of conductive layers are used for a source electrode layer and a drain electrode layer (hereinafter also collectively referred to as source or drain electrode layers) of a thin film transistor that uses oxide semiconductor. For example, a stacked film of titanium and platinum is known as a metal film (Non-patent Document 1), an oxide including indium (In) and zinc (Zn) is known as a light-transmitting conductive film (Non-patent Document 2), and a stacked film of indium tin oxide and gold is known as a stacked film of a metal film and a light-transmitting conductive film (Non-patent Document 3).

On the contrary, an aluminum film is excellent in conductivity and processability and inexpensive; therefore, the aluminum film is actively applied to a wiring material of a semiconductor element. However, since aluminum atoms are likely to be diffused, it is known that if an aluminum film is simply used as a wiring material, problems due to diffusion of aluminum atoms, such as hillocks, electromigration, or stress migration, are caused. In particular, heat treatment in a manufacturing process of a semiconductor element promotes diffusion of aluminum atoms.

In order to suppress diffusion of aluminum atoms, a method of adding impurities and a method of stacking a high-melting-point metal material such as tungsten or molybdenum are known. In particular, a structure in which a high-melting-point metal material is sandwiched between adjacent layers is effective for enabling diffusion of aluminum atoms to be suppressed. Such a layer including a high-melting-point metal material is called a barrier metal layer.

REFERENCE

Patent Document

[Patent Document 1] Japanese Published Patent Application No. 2007-123861
[Patent Document 2] Japanese Published Patent Application No. 2007-96055

Non-Patent Document

[Non-patent Document 1] APPLIED PHYSICS LETTERS 90, 262106 (2007)
[Non-patent Document 2] APPLIED PHYSICS LETTERS 91, 113505 (2007)
[Non-patent Document 3] APPLIED PHYSICS LETTERS 92, 133512 (2008)

SUMMARY OF THE INVENTION

In a thin film transistor that uses an oxide semiconductor film including indium, gallium, and zinc for a channel formation region, high operation speed, a relatively simple manufacturing process, and sufficient reliability are required. However, electric characteristics and reliability of the thin film transistor are, in some cases, impaired by diffusion of an impurity element into a channel region.

In the case where a first conductive film including aluminum as a main component is used for source or drain electrode layers, if such a structure that a second conductive film formed using a high-melting-point metal material is sandwiched between the first conductive film and a semiconductor layer for forming a channel formation region is employed, the second conductive film serves as a barrier layer. Accordingly, a phenomenon in which aluminum atoms are diffused into a channel region can be prevented.

However, when the stacked conductive film of the first conductive film including aluminum as a main component and the second conductive film formed using a high-melting-point metal material is etched to form source or drain electrode layers, first conductive layers including aluminum as a main component are exposed at edge portions of the source or drain electrode layers. In addition, when an oxide semiconductor film is stacked over the source or drain electrode layers, the first conductive layers including aluminum as a main component, which are exposed at the edge portions, are in direct contact with the oxide semiconductor film. Further, the structure in which the first conductive layers including aluminum as a main component sandwich the channel region is formed, which causes a problem in that aluminum atoms are likely to be diffused into the oxide semiconductor film including indium, gallium, and zinc from the edge portions of the first conductive layers including aluminum as a main component.

Thin film transistor characteristics of the semiconductor element that uses an oxide semiconductor including indium, gallium, and zinc are improved by heat treatment (specifically, on current is increased and variations in characteristics of transistors are reduced). Therefore, it is preferable that the heat treatment be performed after formation of the oxide semiconductor film including indium, gallium, and zinc.

However, the heat treatment promotes a phenomenon in which aluminum atoms are thermally diffused from the first conductive layers including aluminum as a main component to the oxide semiconductor layer.

It is an object of an embodiment of the present invention to provide a thin film transistor in which an oxide semiconductor film including indium, gallium, and zinc is stacked over source or drain electrode layers including first conductive layers including aluminum as a main component and in which aluminum atoms are unlikely to be diffused into the oxide semiconductor layer from the first conductive layers.

Furthermore, it is an object to provide a manufacturing method of a thin film transistor in which an oxide semiconductor film including indium, gallium, and zinc is stacked over source or drain electrode layers including first conductive layers including aluminum as a main component and in which aluminum atoms are unlikely to be diffused into the oxide semiconductor layer from the first conductive layers.

An embodiment of the present invention is a semiconductor device provided with barrier layers to prevent aluminum atoms from diffusing from the first conductive layers including aluminum as a main component to the oxide semiconductor film including indium, gallium, and zinc, and a manufacturing method thereof. Further, an aspect of an embodiment of the present invention is a semiconductor device in which layers including aluminum as a main component, which are subjected to oxidation treatment, and an oxide semiconductor layer including indium, gallium, and zinc are in contact with each other at edge portions of source or drain electrode layers, and a manufacturing method thereof.

Specifically, part of the first conductive layers including aluminum as a main component, which appears at the edge portions of the conductive layers, is intentionally oxidized, so that barrier layers are formed. Note that the barrier layers have a thickness of greater than 0 nm and less than or equal to 5 nm, and include dense non-hydrated aluminum oxide as a main component.

An embodiment of the present invention is a semiconductor device which includes an oxide semiconductor layer including indium, gallium, and zinc; a first conductive layer including aluminum as a main component; a second conductive layer formed using a high-melting-point metal material; and a barrier layer including aluminum oxide as a main component, in which the second conductive layer is stacked over the first conductive layer, the barrier layer is formed in an edge portion of the first conductive layer, and the oxide semiconductor layer is provided in contact with the second conductive layer or the barrier layer.

Another embodiment of the present invention is a semiconductor device which includes a gate insulating layer; a gate electrode layer provided on one side of the gate insulating layer; an oxide semiconductor layer provided on the other side of the gate insulating layer; and a source electrode layer and a drain electrode layer in each of which a second conductive layer formed using a high-melting-point metal material is stacked over a first conductive layer that is in contact with the gate insulating layer and includes aluminum as a main component and each of which is provided with a barrier layer including aluminum oxide as a main component at an edge portion of the first conductive layer, in which the oxide semiconductor layer is in contact with the second conductive layer and the barrier layer.

Still another embodiment of the present invention is a semiconductor device which includes a source electrode layer and a drain electrode layer in each of which a second conductive layer formed using a high-melting-point metal material is stacked over a first conductive layer including aluminum as a main component and each of which is provided with a barrier layer including aluminum oxide as a main component at an edge portion of the first conductive layer, an oxide semiconductor layer which covers end portions of the source electrode layer and the drain electrode layer; a gate insulating layer which covers the oxide semiconductor layer; and a gate electrode layer which overlaps the end portions of the source electrode layer and the drain electrode layer with the oxide semiconductor layer and the gate insulating layer interposed therebetween, in which the oxide semiconductor layer is in contact with the second conductive layer and the barrier layer.

Further, in the semiconductor device, the barrier layer including aluminum oxide as a main component has a thickness of greater than 0 nm and less than or equal to 5 nm.

Further, another embodiment of the present invention is a manufacturing method of a thin film transistor, which includes the steps of forming a source electrode layer and a drain electrode layer in each of which a second conductive layer formed using a high-melting-point metal material is stacked over a first conductive layer including aluminum as a main component; forming a barrier layer including aluminum oxide as a main component by performing oxidation treatment on an exposed edge portion of the first conductive layer of the source electrode layer and the drain electrode layer; and stacking an oxide semiconductor layer including indium, gallium, and zinc so that the oxide semiconductor layer is in contact with the second conductive layer and the barrier layer.

According to an embodiment of the present invention, the second conductive layers formed using a high-melting-point metal material or the barrier layers including aluminum oxide as a main component are formed between the oxide semiconductor layer including indium, gallium, and zinc and the first conductive layers including aluminum as a main component; accordingly, aluminum atoms can be prevented from being diffused into the oxide semiconductor layer. In particular, even when the oxide semiconductor layer including indium, gallium, and zinc is subjected to heat treatment, diffusion of aluminum atoms to the oxide semiconductor layer can be suppressed. In addition, electric corrosion (also referred to as electrochemical corrosion) caused between the oxide semiconductor layer including indium, gallium, and zinc and the first conductive layers including aluminum as a main component can be prevented. Therefore, a semiconductor device including a reliable thin film transistor can be provided.

DETAILED DESCRIPTION OF THE INVENTION

Figure 1A:
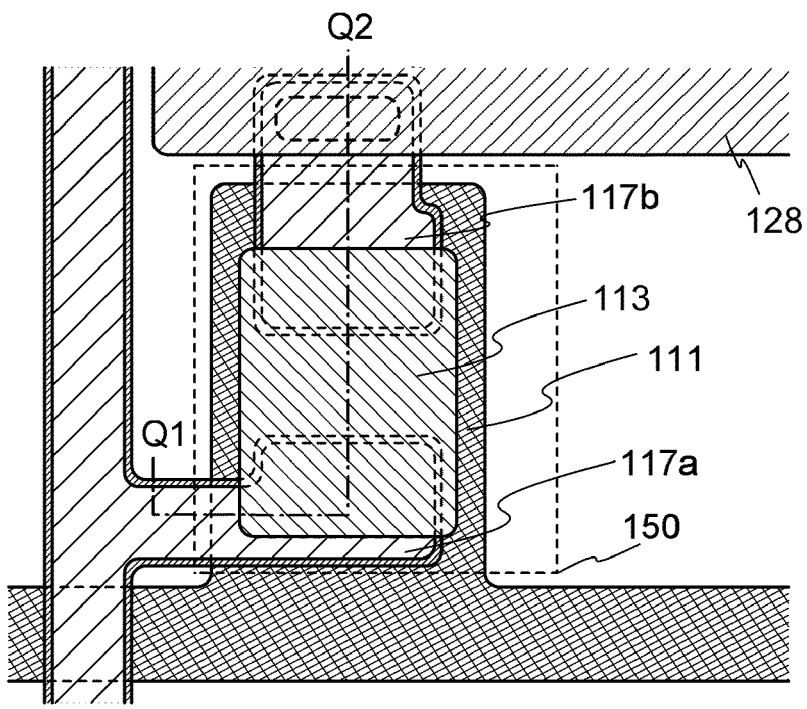
FIGS. 1A and 1B are a top view and a cross-sectional view, respectively, illustrating a semiconductor device.

Embodiments of the present invention will be described with reference to the accompanying drawings. However, the present invention is not limited to the following description, and it will be easily understood by those skilled in the art that various changes and modifications can be made in modes and details without departing from the spirit and scope of the present invention. Therefore, the present invention should not be construed as being limited to the description of the following embodiments. Note that a common reference numeral refers to the same part or a part having a similar function throughout the drawings in the structures of the present invention described below, and the description thereof is omitted.

Embodiment 1

In Embodiment 1, a thin film transistor and a manufacturing process thereof will be described with reference to FIGS. 1A and 1B, FIGS. 2A to 2C, and FIGS. 3A to 3C.

Figure 1B:
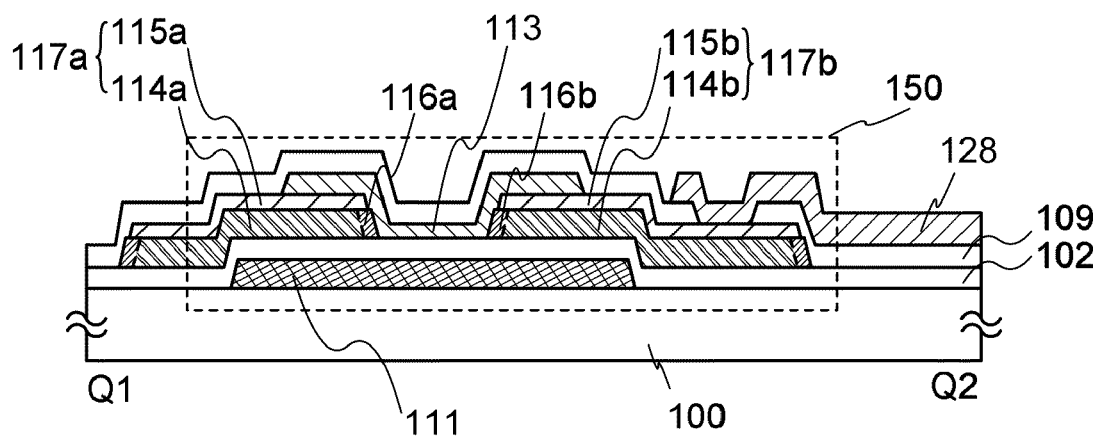

FIGS. 1A and 1B illustrate a thin film transistor of this embodiment. FIG. 1A is a plan view and FIG. 1B is a cross-sectional view taken along line Q1-Q2 in FIG. 1A. In a thin film transistor 150 illustrated in FIGS. 1A and 1B, a gate electrode layer 111 is formed over a substrate 100, and a gate insulating film 102 is formed over the gate electrode layer 111. Source or drain electrode layers (117a, 117b) are formed over the gate insulating film 102 by stacking second conductive layers (115a, 115b) which are formed using a high-melting-point metal material over first conductive layers (114a, 114b) including aluminum as a main component so that end portions of the source or drain electrode layers (117a, 117b) overlap the gate electrode layer 111. An oxide semiconductor layer 113 is formed so as to overlap the gate electrode layer 111 and to be in contact with the second conductive layers (115a, 115b) which are formed using a high-melting-point metal material in the source or drain electrode layers and barrier layers (116a, 116b) which include aluminum oxide as a main component and are located in edge portions of the source or drain electrode layers.

The oxide semiconductor layer 113 is in contact with the second conductive layers (115a, 115b) which are formed using a high-melting-point metal material in the source or drain electrode layers and the barrier layers (116a, 116b) which include aluminum oxide as a main component and are located in the edge portions of the source or drain electrode layers.

In this embodiment, the barrier layers (116a, 116b) which include aluminum oxide as a main component are formed in the edge portions of the source or drain electrode layers (117a, 117b) in which the first conductive layers (114a, 114b) including aluminum as a main component and the second conductive layers (115a, 115b) which are formed using a high-melting-point metal material are stacked. Thus, the oxide semiconductor and the first conductive layers including aluminum as a main component do not directly touch each other.

In this specification, the oxide semiconductor used for the oxide semiconductor layer is a thin film of $InMO_3(ZnO)_m$ (m>0) and the thin film is used as a semiconductor layer to manufacture a thin film transistor. Note that M indicates one metal element or a plurality of metal elements selected from Ga, Fe, Ni, Mn, and Co. For example, as well as a case where M is Ga, there are cases where M includes, in addition to Ga, a metal element selected from the above-described metal elements, such as a case where M is Ga and Ni, a case where M is Ga and Fe, and the like. Furthermore, there are some cases in which the oxide semiconductor includes Fe, Ni, any of the other transition metal elements, or an oxide of the transition metal element in addition to the metal element as M. In this specification, this thin film is also referred to as an In—Ga—Zn—O based non-single-crystal film.

The composition rate of the In—Ga—Zn—O based non-single-crystal film changes depending on its film formation condition. Here, a condition in which a target of $In_2O_3$, $Ga_2O_3$, and ZnO (1:1:1) (the composition ratio of In, Ga, and Zn is 1:1:0.5) is used and the flow rate of an argon gas is 40 sccm in a sputtering method is referred to as Condition 1, and a condition in which the flow rate of an argon gas is 10 sccm and the flow rate of oxygen is 5 sccm in a sputtering method is referred to as Condition 2.

A typical composition ratio of an oxide semiconductor film, which is measured by inductively coupled plasma mass spectrometry (ICP-MS), is $InGa_{0.95}Zn_{0.41}O_{3.33}$ in the case of Condition 1, and $InGa_{0.94}Zn_{0.40}O_{3.31}$ in the case of Condition 2.

A typical composition ratio of an oxide semiconductor film, which is quantified by Rutherford backscattering spectrometry (RBS), is $InGa_{0.93}Zn_{0.44}O_{3.49}$ in the case of Condition 1, and $InGa_{0.92}Zn_{0.45}O_{3.86}$ in the case of Condition 2.

Since the In—Ga—Zn—O based non-single-crystal film is formed by a sputtering method and then subjected to heat treatment at a temperature of from 200° C. to 500° C., typically, from 300° C. to 400° C. inclusive for 10 minutes to 100 minutes, an amorphous structure is observed when the crystal structure of the In—Ga—Zn—O based non-single-crystal film is analyzed by X-ray diffraction (XRD).

Further, the amount of light absorbed by the oxide semiconductor layer including indium, gallium, and zinc is small and thus the oxide semiconductor layer is unlikely to be photoexcited; therefore, it is not necessary to cover a channel formation region with the gate electrode layer in order to shield the channel formation region from light. That is, the overlap area of the gate electrode layer and the source or drain electrode layers can be reduced in the channel formation region, whereby parasitic capacitance can be reduced.

A manufacturing method of the thin film transistor 150 in FIGS. 1A and 1B will be described with reference to FIGS. 2A to 2C and FIGS. 3A to 3C.

As the substrate 100, any of the following substrates can be used: non-alkaline glass substrates made of barium borosilicate glass, aluminoborosilicate glass, aluminosilicate glass, and the like by a fusion method or a float method; ceramic substrates; plastic substrates having heat resistance enough to withstand a process temperature of this manufacturing process; and the like. For example, a glass substrate which contains barium oxide (BaO) more than boric oxide ($B_2O_3$) and has a strain point of 730° C. or higher is preferably used. This is because the glass substrate is not warped even when the oxide semiconductor layer is subjected to heat treatment at a high temperature of approximately 700° C. Alternatively, a metal substrate such as a stainless steel alloy substrate, provided with an insulating film over its surface, may be used. When the substrate 100 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

An insulating film may be formed as a base film over the substrate 100. As the base film, the insulating film may be formed using a single layer or stacked layers of a silicon oxide film, a silicon nitride film, a silicon oxynitride film, and/or a silicon nitride oxide film by a CVD method, a sputtering method, or the like.

Next, a conductive film for forming a gate wiring including the gate electrode layer 111, a capacitor wiring, and a terminal portion is formed. The conductive film is desirably formed using a low-resistant conductive material such as aluminum (Al) or copper (Cu); however, since aluminum alone has disadvantages such as low heat resistance and a tendency to be corroded, it is used in combination with a material having both heat resistance and conductivity. As the heat-resistant conductive material, an element selected from titanium (Ti), tantalum (Ta), tungsten (W), molybdenum (Mo), chromium (Cr), neodymium (Nd), and scandium (Sc), an alloy containing any of the elements as its component, an alloy film including a combination of the elements, or a nitride containing any of the elements as its component may be used.

Alternatively, a transparent conductive film may be used; in such a case, indium tin oxide, indium tin oxide containing silicon or silicon oxide, indium zinc oxide, zinc oxide, or the like can be used as a material.

The conductive film for forming the gate electrode layer 111 is formed to have a thickness of from 50 nm to 300 nm inclusive. When the thickness of the conductive film for forming the wiring layer including the gate electrode layer 111 is 300 nm or less, disconnection of a semiconductor film and a wiring to be formed later can be avoided. Further, in the case where the conductive film for forming the wiring layer including the gate electrode layer 111 has a thickness of 150 nm or larger, the resistance of the gate electrode can be lowered and the size of the substrate can be increased.

Figure 2A:
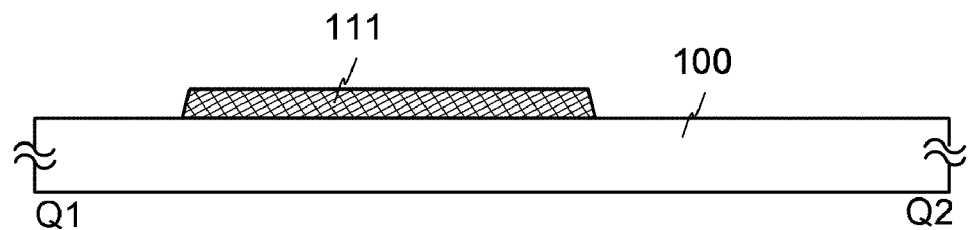
FIGS. 2A to 2C are cross-sectional views illustrating a manufacturing process of a thin film transistor.

Next, an unnecessary part of the conductive film formed over the substrate is etched with the use of a resist mask which is formed using a first photomask in this embodiment, whereby wirings and electrodes (the gate wiring including the gate electrode layer 111, the capacitor wiring, and the terminal) are formed. At this time, etching is performed so that a taper shape is formed at least at an edge portion of the gate electrode layer 111. A cross-sectional view at this stage is illustrated in FIG. 2A.

Then, the gate insulating film 102 is formed. Examples of the insulating film that can be used as the gate insulating film 102 is as follows: a silicon oxide film, a silicon nitride film, a silicon oxynitride film, a silicon nitride oxide film, an aluminum oxide film, a magnesium oxide film, an aluminum nitride film, an yttrium oxide film, a hafnium oxide film, and a tantalum oxide film.

Here, a silicon oxynitride film means a film that contains more oxygen than nitrogen and includes oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. Further, a silicon nitride oxide film means a film that contains more nitrogen than oxygen and includes oxygen, nitrogen, silicon, and hydrogen at concentrations ranging from 15 atomic % to 30 atomic %, 20 atomic % to 35 atomic %, 25 atomic % to 35 atomic %, and 15 atomic % to 25 atomic %, respectively.

The gate insulating film may have either a single layer or stacked layers of two or three layers. For example, by forming the gate insulating film that is in contact with the substrate using a silicon nitride film or a silicon nitride oxide film, adhesion between the substrate and the gate insulating film is increased, and further, impurities from the substrate can be prevented from diffusing into the oxide semiconductor layer 113 when a glass substrate is used as the substrate. Furthermore, oxidation of the gate electrode layer 111 can be prevented. That is, film peeling can be prevented, and thus electric characteristics of a thin film transistor which is completed later can be improved.

The thickness of the gate insulating film 102 is from 50 nm to 250 nm inclusive. It is preferable that the thickness of the gate insulating film be 50 nm or greater because the gate insulating film can cover unevenness of the wiring layer including the gate electrode layer 111.

Here, a silicon oxide film with a thickness of 100 nm is formed by a plasma CVD method or a sputtering method as the gate insulating film 102.

The source or drain electrode layers are formed using a conductive film in which a first conductive film including aluminum, which is a low-resistant conductive material, as a main component and a second conductive film which is formed using a high-melting-point metal material are stacked. The second conductive film which is formed using a high-melting-point metal material is formed between the first conductive film and the oxide semiconductor film. Note that although the source or drain electrode layers each have a two-layer structure including the first conductive layer and the second conductive layer in this embodiment, if a structure in which the first conductive layer including aluminum as a main component is not in direct contact with the oxide semiconductor layer is employed, a stacked film of two or more layers may be employed. For example, the source or drain electrode layers can each have a three-layer structure in which a first conductive layer including aluminum as a main component is sandwiched between a second conductive layer and a third conductive layer which are formed using a high-melting-point metal material.

For the first conductive film including aluminum as a main component, pure aluminum (Al) can be used; however, it is preferable to use an element which improves heat resistance or an element which prevents hillocks, such as titanium (Ti), tantalum (Ta), tungsten (W), molybdenum (Mo), chromium (Cr), neodymium (Nd), scandium (Sc), nickel, platinum, copper, gold, silver, manganese, carbon, silicon, or the like; an alloy material containing any of the elements as its main component; or an aluminum alloy to which a compound is added.

As the high-melting-point metal material used for the second conductive film, an element selected from titanium (Ti), tantalum (Ta), tungsten (W), molybdenum (Mo), chromium (Cr), neodymium (Nd), and scandium (Sc), an alloy containing any of the elements as its component, an alloy film including a combination of the elements, or a nitride containing any of the elements as its component may be used.

The conductive film for forming the source or drain electrode layers is formed by a sputtering method or a vacuum evaporation method. The thickness of the conductive film for forming the source or drain electrode layers is preferably from 50 nm to 500 nm inclusive. A thickness of 500 nm or less of the conductive film is effective for preventing disconnection of a semiconductor film and a wiring to be formed later.

Next, a resist mask is formed over the conductive film with the use of a second photomask in this embodiment. An unnecessary part of the conductive film is selectively etched using the resist mask, whereby the source or drain electrode layers (117a, 117b) which are stacked films of the second conductive layers (115a, 115b) which are formed using a high-melting-point metal material and the first conductive layers (114a, 114b) including aluminum as a main component are formed.

Figure 2B:
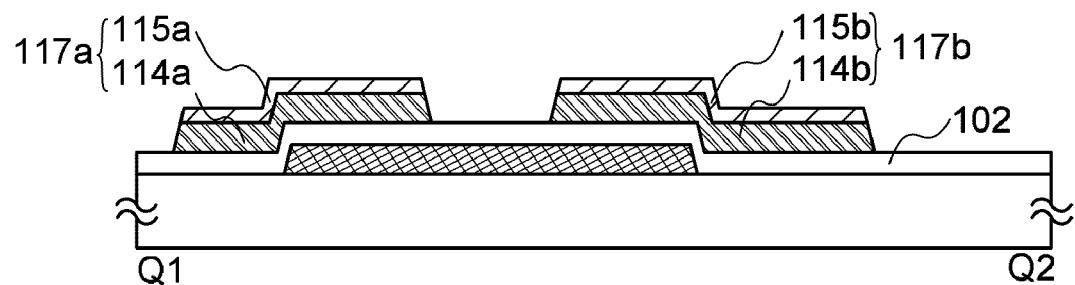

By the etching, the first conductive layers (114a, 114b) including aluminum as a main component appear at edge portions of the source or drain electrode layers (117a, 117b). In other words, since the source or drain electrode layers (117a, 117b) are formed using the conductive film which is a stack of the first conductive film including aluminum as a main component and the second conductive film, the first conductive film including aluminum as a main component appears at the edge portions of the source or drain electrode layers (117a, 117b), in particular, side surface portions thereof. A cross-sectional view at this stage is illustrated in FIG. 2B.

Figure 2C:
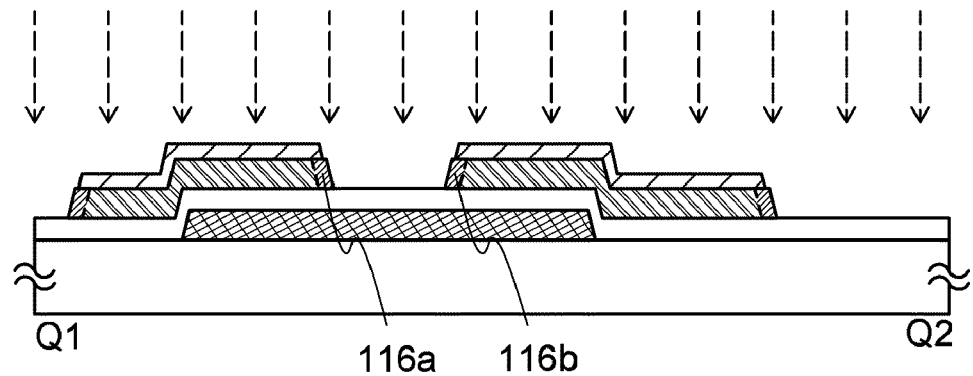

Next, the first conductive layers including aluminum as a main component which are exposed along the edge portions of the source or drain electrode layers (117a, 117b) are subjected to oxidation treatment, whereby the barrier layers (116a, 116b) which include aluminum oxide as a main component are formed. The barrier layers including aluminum oxide as a main component have a thickness of greater than 0 nm and less than or equal to 4 nm and are preferably non-hydrated oxide films. The non-hydrated oxide film is a dense film including no moisture. Even if the barrier layers contain moisture, it is favorable that the barrier layers contain a smaller amount of moisture in order to prevent entry of contaminant impurities. Note that the thickness of the barrier layers means the average length in a direction perpendicular to the surface of the barrier layers to the interface with the first conductive layers including aluminum as a main component. A cross-sectional view at this stage is illustrated in FIG. 2C. As illustrated in FIG. 2C, the barrier layers formed by the oxidation treatment are, in some cases, extend to an outer side than the edge portions of the second conductive layers. In this case, the channel length is a distance between a conductive portion of the source electrode layer 117a and a conductive portion of the drain electrode layer 117b.

The non-hydrated oxide film is formed by oxidizing a metal film. As the oxidation method, oxygen plasma treatment, ozone treatment using ultraviolet light, and treatment using hydrogen peroxide can be given. Any of the treatments can be performed alone or the treatments can be performed in combination. As long as barrier layers which suppress diffusion of aluminum atoms can be formed, the treatment is not limited to the oxidation treatments. As an alternate treatment method, nitridation treatment can be performed, for example, to form aluminum nitride for the barrier layers.

After the oxidation treatment, it is preferable that the oxide semiconductor film be formed in succession without exposing the source or drain electrode layers (117a, 117b) to air. By successive formation, an interface of the stacked layers is not contaminated by an air constituent such as moisture, an impurity element floating in air, and dust; accordingly, variations in characteristics of thin film transistors can be reduced.

Next, the oxide semiconductor film is formed over the source or drain electrode layers (117a, 117b).

Here, the oxide semiconductor film is formed under an argon or oxygen atmosphere with the use of an oxide semiconductor target including indium, gallium, and zinc with a diameter of 8 inches (the composition ratio of $In_2O_3$, $Ga_2O_3$, and ZnO is 1:1:1), with a distance between the substrate and the target of 170 mm, at a pressure of 0.4 Pa and a direct current (DC) power of 0.5 kW. Note that a pulsed direct current (DC) power is preferably used because dust can be reduced and the thickness distribution becomes uniform. The thickness of the oxide semiconductor film is set at 5 nm to 200 nm. In this embodiment, the thickness of the oxide semiconductor film is 100 nm.

The oxide semiconductor film is formed in an atmosphere including excessive oxygen so as to include much oxygen. Specifically, an oxygen atmosphere (or a condition in which the flow rate of an oxygen gas is higher than that of an argon gas and the flow ratio of the oxygen gas to the argon gas is 1 or more to 1) is employed as the film formation condition of the oxide semiconductor film. In the case where the oxide semiconductor film includes much oxygen, conductivity can be decreased, and further, off current can be reduced. Accordingly, a thin film transistor with a high on/off ratio can be obtained.

Then, a resist mask is formed with the use of a third photomask in this embodiment, and an unnecessary part is etched, whereby the oxide semiconductor layer 113 including indium, gallium, and zinc is formed. The etching method of the oxide semiconductor layer 113 including indium, gallium, and zinc may be dry etching without limitation to wet etching.

Here, the unnecessary part is removed by wet etching with the use of ITO07N (produced by Kanto Chemical Co., Inc.), so that the oxide semiconductor layer 113 including indium, gallium, and zinc is formed.

Figure 3A:
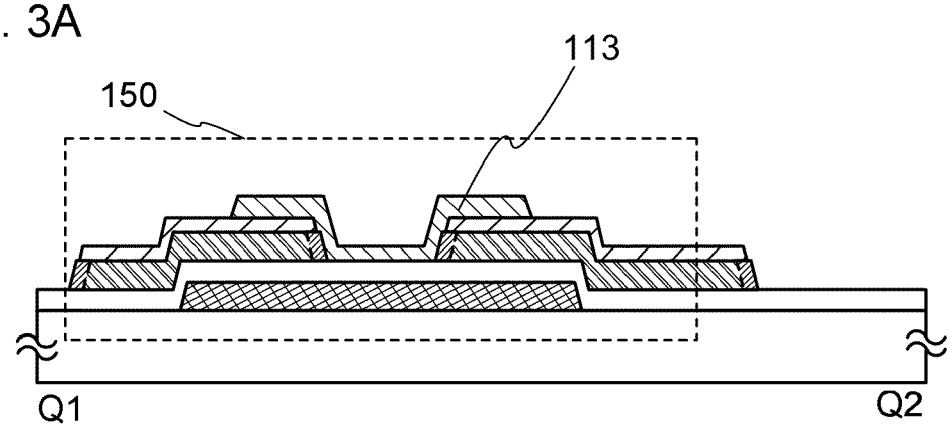
FIGS. 3A to 3C are cross-sectional views illustrating a manufacturing process of a thin film transistor.

Through the above-described process, the thin film transistor 150 in which the oxide semiconductor layer 113 including indium, gallium, and zinc is used for a channel formation region can be manufactured. A cross-sectional view at this stage is illustrated in FIG. 3A.

The thin film transistor using the oxide semiconductor including indium, gallium, and zinc is preferably subjected to heat treatment at 200° C. to 600° C., typically, 300° C. to 500° C. Here, the thin film transistor is put in a furnace and subjected to heat treatment at 350° C. for 1 hour under a nitrogen atmosphere. Note that the atmosphere of the heat treatment is not limited to a nitrogen atmosphere, and an air atmosphere or an oxygen atmosphere may also be employed. By this heat treatment, rearrangement at an atomic level is performed in the oxide semiconductor film including indium, gallium, and zinc. The heat treatment here (including light annealing) is important for reducing distortion which inhibits transfer of carriers. Note that the timing of the heat treatment is not particularly limited as long as it is performed after formation of the oxide semiconductor film and, for example, the heat treatment may be performed after formation of a pixel electrode.

Further, the oxide semiconductor layer 113 may be subjected to plasma treatment. By performing plasma treatment, damage to the oxide semiconductor layer 113 due to etching can be recovered. The plasma treatment is preferably performed in $O_2$ or $N_2O$, preferably a $N_2$ atmosphere including oxygen, a He atmosphere including oxygen, or an Ar atmosphere including oxygen. Alternatively, $Cl_2$ or $CF_4$ may be added to the above-described atmosphere. Note that the plasma treatment is preferably performed with non-bias applied.

Next, a protective insulating film 109 which covers the oxide semiconductor layer 113 including indium, gallium, and zinc is formed. A silicon nitride film, a silicon oxide film, a silicon oxynitride film, or the like obtained by a sputtering method or the like can be used as the protective insulating film 109.

Figure 3B:
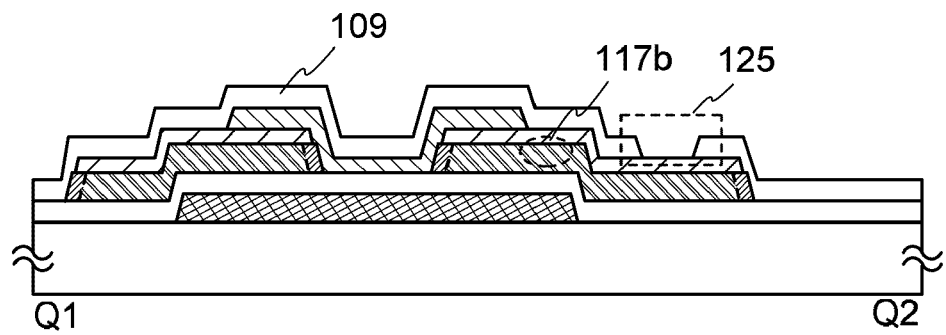

Then, a resist mask is formed with the use of a fourth photomask in this embodiment, and the protective insulating film 109 is etched to form a contact hole 125 which reaches the drain electrode layer 107b. A cross-sectional view at this stage is illustrated in FIG. 3B.

Next, a third conductive layer after the gate electrode layer 111 and the source or drain electrode layers (117a, 117b) is formed. In the case of applying the semiconductor device according to an embodiment of the present invention to a display device, the third conductive layer serves as a pixel electrode, a wiring, and a terminal portion of the display device.

Here, a transparent conductive film is formed as the third conductive layer. Indium oxide ($In_2O_3$), an indium oxide tin oxide alloy ($In_2O_3$—$SnO_2$, abbreviated as ITO), or the like is deposited as a material of the transparent conductive film by a sputtering method, a vacuum evaporation method, or the like. The etching treatment of such a material is performed with a hydrochloric-acid based solution. However, since etching of ITO is particularly likely to leave residue, an indium oxide zinc oxide alloy ($In_2O_3$—ZnO) may be used in order to improve etching processability.

Figure 3C:
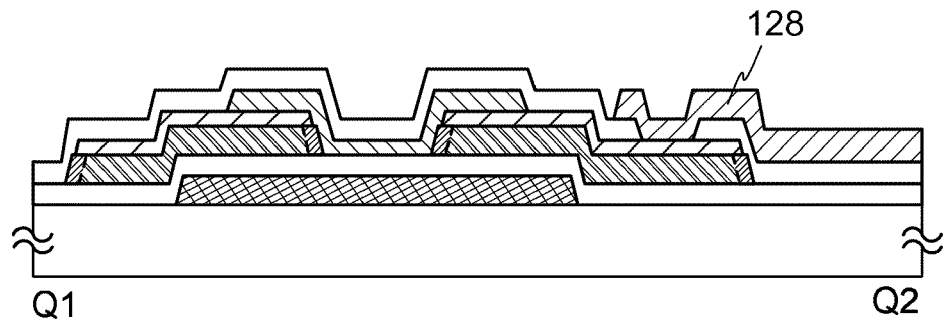

Next, a resist mask is formed with the use of a fifth photomask in this embodiment, and an unnecessary part is etched to form a third conductive layer 128. A cross-sectional view at this stage is illustrated in FIG. 3C.

By the above-described method, the bottom-gate type thin film transistor illustrated in FIGS. 1A and 1B according to an embodiment of the present invention is manufactured. In the thin film transistor formed in this embodiment, the second conductive layers formed using a high-melting-point metal material or the barrier layers including aluminum oxide as a main component are formed between the oxide semiconductor layer including indium, gallium, and zinc and the first conductive layers including aluminum as a main component; accordingly, aluminum atoms can be prevented from being diffused into the oxide semiconductor layer. In particular, even when the oxide semiconductor layer including indium, gallium, and zinc is subjected to heat treatment, diffusion of aluminum atoms to the oxide semiconductor layer can be suppressed. In addition, electric corrosion (also referred to as electrochemical corrosion) caused between the oxide semiconductor layer including indium, gallium, and zinc and the first conductive layers including aluminum as a main component can be prevented. Therefore, a semiconductor device including a reliable thin film transistor can be provided.

Embodiment 2

In Embodiment 2, a thin film transistor and a manufacturing method thereof, which are different from those in Embodiment 1, will be described with reference to FIGS. 4A and 4B, FIGS. 5A to 5C, and FIGS. 6A to 6C.

Figure 4A:
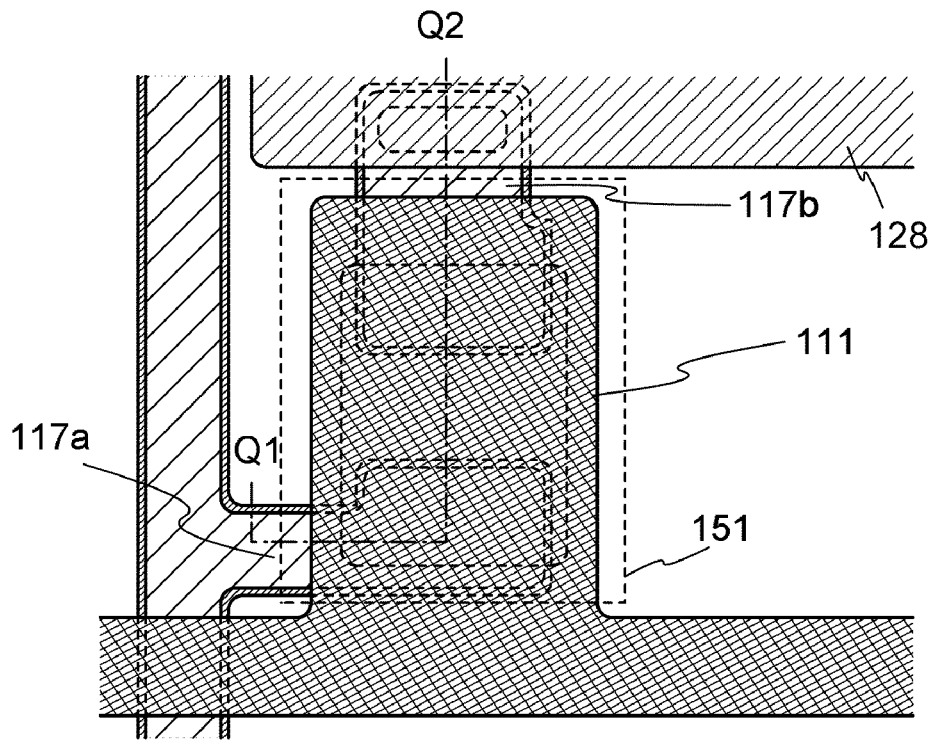
FIGS. 4A and 4B are a top view and a cross-sectional view, respectively, illustrating a semiconductor device.
Figure 4B:
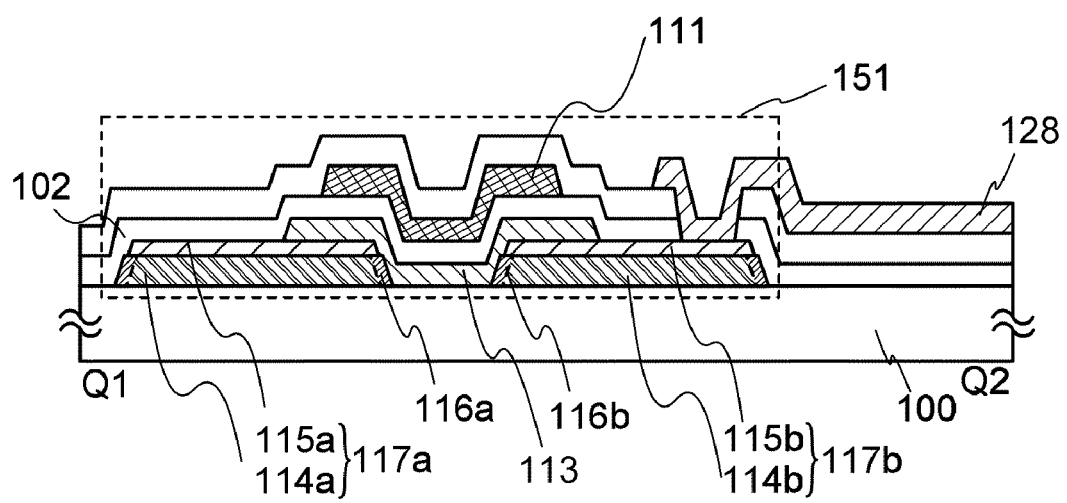

FIGS. 4A and 4B illustrate an embodiment different from that of Embodiment 1. FIG. 4A is a plan view and FIG. 4B is a cross-sectional view taken along line Q1-Q2 in FIG. 4A.

In a thin film transistor 151 illustrated in FIGS. 4A and 4B, source or drain electrode layers (117a, 117b) are formed over a substrate 100. In the source or drain electrode layers (117a, 117b), second conductive layers (115a, 115b) which are formed using a high-melting-point metal material are stacked over first conductive layers (114a, 114b) including aluminum as a main component. An oxide semiconductor layer 113 is formed to be in contact with the second conductive layers (115a, 115b) which are formed using a high-melting-point metal material in the source or drain electrode layers and barrier layers (116a, 116b) which include aluminum oxide as a main component and are located in edge portions of the source or drain electrode layers. A gate insulating film 102 which covers the oxide semiconductor layer 113 is formed, and a gate electrode layer 111 is formed so as to overlap end portions of the source or drain electrode layers (117a, 117b) with the gate insulating film 102 interposed therebetween.

In an embodiment of the present invention, the barrier layers (116a, 116b) which include aluminum oxide as a main component are formed in the edge portions of the source or drain electrode layers (117a, 117b) in which the first conductive layers (114a, 114b) including aluminum as a main component and the second conductive layers (115a, 115b) which are formed using a high-melting-point metal material are stacked. Thus, the oxide semiconductor and the first conductive layers including aluminum as a main component do not directly touch each other.

A manufacturing method of the thin film transistor 151 of FIGS. 4A and 4B will be described with reference to FIGS. 5A to 5C and FIGS. 6A to 6C.

A conductive film for forming the source or drain electrode layers is formed by stacking, over a substrate, a second conductive film which is formed using a high-melting-point metal material over a first conductive film including aluminum, which is a low-resistant conductive material, as a main component. Note that materials of the substrate, the first conductive film including aluminum as a main component, and the second conductive film which is formed using a high-melting-point metal material can be similar to those of Embodiment 1.

Figure 5A:
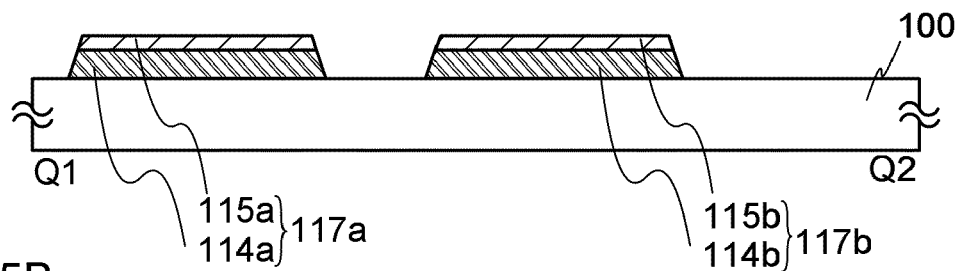
FIGS. 5A to 5C are cross-sectional views illustrating a manufacturing process of a thin film transistor.

Here, the first conductive film and the second conductive film are stacked by a sputtering method. Then, an unnecessary part of the conductive film formed over the substrate 100 is etched using a resist mask that is formed with the use of a first photomask in this embodiment, whereby wirings and electrodes (a signal line, a capacitor wiring, and a terminal including the source or drain electrode layers (117a, 117b)) are formed. At this time, etching is performed so that a taper shape is formed at least at edge portions of the source or drain electrode layers (117a, 117b). In addition, first conductive layers including aluminum as a main component are exposed at the edge portions of the electrode layers formed here. A cross-sectional view at this stage is illustrated in FIG. 5A.

Figure 5B:
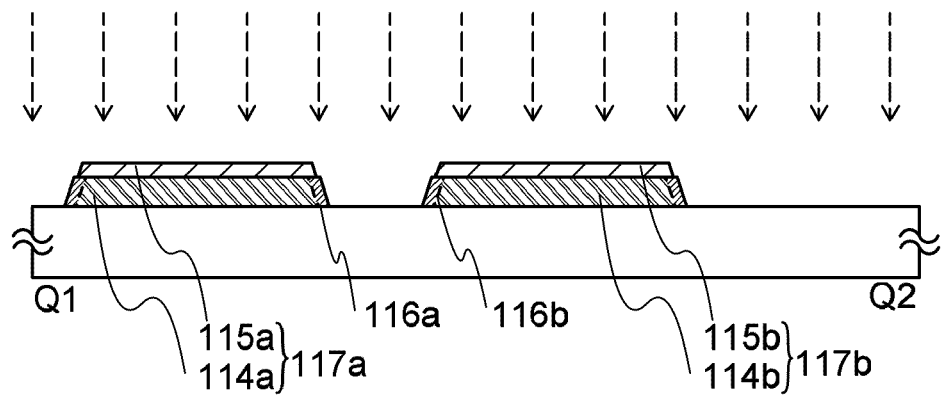

Next, the first conductive layers including aluminum as a main component, which are exposed at the edge portions of the source or drain electrode layers (117a, 117b) are subjected to oxidation treatment in a manner similar to that in Embodiment 1, whereby the barrier layers (116a, 116b) which includes aluminum oxide as a main component are formed. The barrier layers which include aluminum oxide as a main component have a thickness of greater than 0 nm and less than or equal to 5 nm and are preferably non-hydrated oxide films. A cross-sectional view at this stage is illustrated in FIG. 5B.

Next, an oxide semiconductor film is formed over the source or drain electrode layers (117a, 117b). After oxidation treatment is performed on the first conductive layers including aluminum as a main component, it is preferable that the oxide semiconductor film be formed in succession without exposure to air. By successive formation, an interface of the stacked layers is not contaminated by an air constituent such as moisture, an impurity element floating in air, and dust; accordingly, variations in characteristics of thin film transistors can be reduced.

Here, an oxide semiconductor including indium, gallium, and zinc is used for the oxide semiconductor film, and the oxide semiconductor film is formed in an atmosphere including excessive oxygen so as to include much oxygen in a manner similar to that of Embodiment 1. In the case where the oxide semiconductor film includes much oxygen, off current can be reduced. Accordingly, a thin film transistor with a high on/off ratio can be obtained. In this embodiment, the thickness of the oxide semiconductor film is 100 nm.

Next, a resist mask is formed with the use of a second photomask in this embodiment, and an unnecessary part is etched, whereby the oxide semiconductor layer 113 including indium, gallium, and zinc is formed. The etching method of the oxide semiconductor layer 113 may be dry etching without limitation to wet etching.

Figure 5C:
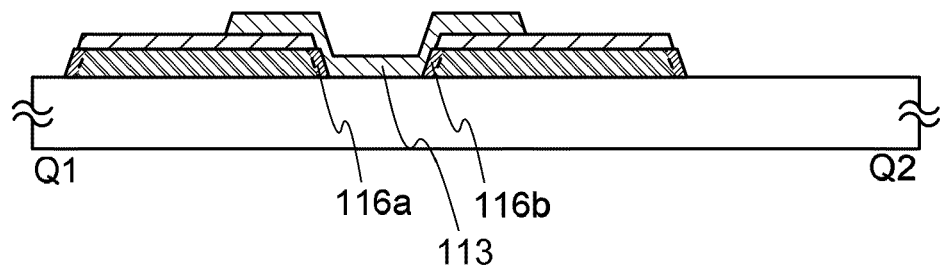

Here, the unnecessary part is removed by wet etching with the use of ITO07N (produced by Kanto Chemical Co., Inc.) in a manner similar to that of Embodiment 1, so that the oxide semiconductor layer 113 including indium, gallium, and zinc is formed. A cross-sectional view at this stage is illustrated in FIG. 5C.

The thin film transistor using the oxide semiconductor including indium, gallium, and zinc is preferably subjected to heat treatment at 200° C. to 600° C., typically, 300° C. to 500° C. Here, the thin film transistor is put in a furnace and subjected to heat treatment at 350° C. for 1 hour under a nitrogen atmosphere. Note that the atmosphere of the heat treatment is not limited to a nitrogen atmosphere, and an air atmosphere or an oxygen atmosphere may also be employed. By this heat treatment, rearrangement at an atomic level is performed in the oxide semiconductor film including indium, gallium, and zinc. The heat treatment here (including light annealing) is important for reducing distortion which inhibits transfer of carriers. Note that the timing of the heat treatment is not particularly limited as long as it is performed after formation of the oxide semiconductor film and, for example, the heat treatment may be performed after formation of a pixel electrode.

Before formation of the gate insulating film, the oxide semiconductor layer 113 may be subjected to plasma treatment. By performing plasma treatment, damage to the oxide semiconductor layer 113 due to etching can be recovered. The plasma treatment is preferably performed in $O_2$ or $N_2O$, preferably a $N_2$ atmosphere including oxygen, a He atmosphere including oxygen, or an Ar atmosphere including oxygen. Alternatively, $Cl_2$ or $CF_4$ may be added to the above-described atmosphere. Note that the plasma treatment is preferably performed with non-bias applied.

Next, the gate insulating film 102 is formed. A gate insulating film similar to that of Embodiment 1 can be used for the gate insulating film 102 and may have either a single layer or stacked layers of two or three layers. Here, a silicon oxide film with a thickness of 100 nm is formed by a sputtering method as the gate insulating film 102.

Then, a conductive film for forming the gate electrode layer 111 is formed. A material similar to that of Embodiment 1 can be used for the conductive film.

Figure 6A:
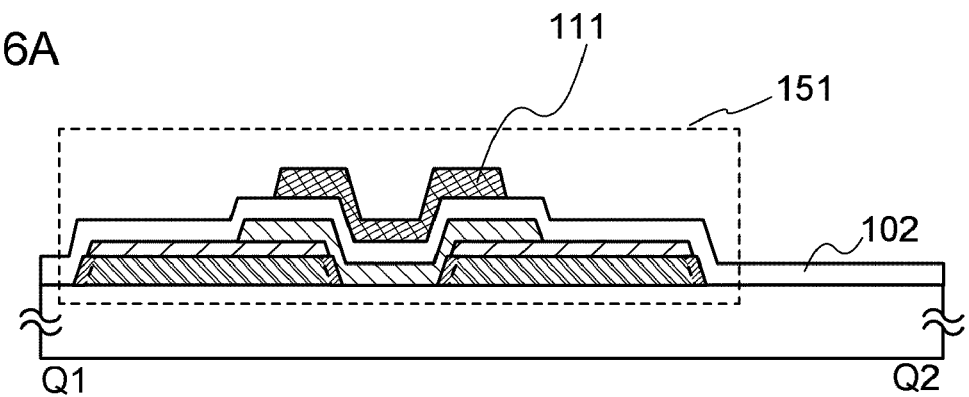
FIGS. 6A to 6C are cross-sectional views illustrating a manufacturing process of a thin film transistor.

Next, an unnecessary part of the conductive film is etched with the use of a resist mask that is formed using a third photomask in this embodiment, whereby the gate electrode layer 111 is formed. Through the above-described process, the thin film transistor 151 in which the oxide semiconductor layer 113 including indium, gallium, and zinc is used for a channel formation region can be manufactured. A cross-sectional view at this stage is illustrated in FIG. 6A.

Next, a protective insulating film 109 which covers the thin film transistor 151 is formed. A silicon nitride film, a silicon oxide film, a silicon oxynitride film, or the like obtained by a sputtering method or the like can be used as the protective insulating film 109.

Figure 6B:
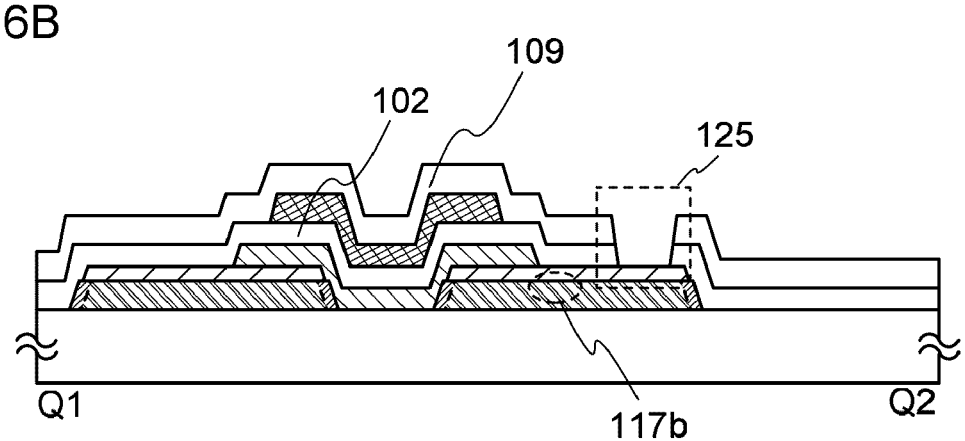

Then, the protective insulating film 109 and the gate insulating film 102 are etched using a resist mask formed with the use of a fourth photomask in this embodiment, so that a contact hole 125 which reaches the drain electrode layer 107b is formed. A cross-sectional view at this stage is illustrated in FIG. 6B.

Next, a third conductive layer after the gate electrode layer 111 and the source or drain electrode layers (117a, 117b) is formed. In the case of applying the semiconductor device according to an embodiment of the present invention to a display device, the third conductive layer serves as a pixel electrode, a wiring, and a terminal portion of the display device.

Here, a transparent conductive film is formed as the third conductive layer. Indium oxide ($In_2O_3$), an indium oxide tin oxide alloy ($In_2O_3$—$SnO_2$, abbreviated as ITO), or the like is deposited as a material of the transparent conductive film by a sputtering method, a vacuum evaporation method, or the like. The etching treatment of such a material is performed with a hydrochloric-acid based solution. However, since etching of ITO is particularly likely to leave residue, an indium oxide zinc oxide alloy ($In_2O_3$—$ZnO$) may be used in order to improve etching processability.

Figure 6C:
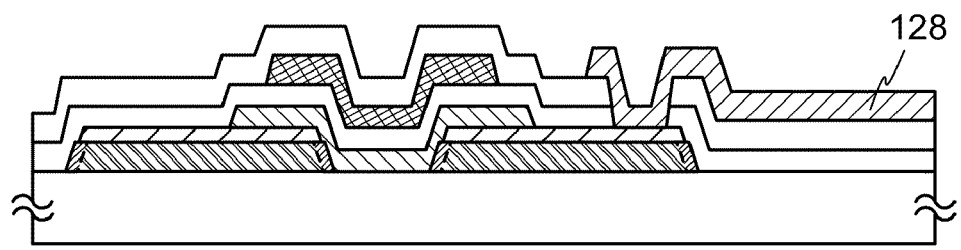

Then, an unnecessary part is etched using a resist mask formed with the use of a fifth photomask in this embodiment, so that a third conductive layer 128 is formed. A cross-sectional view at this stage is illustrated in FIG. 6C.

By the above-described method, the forward-staggered thin film transistor illustrated in FIGS. 4A and 4B according to an embodiment of the present invention is manufactured. In the thin film transistor formed in this embodiment, the second conductive layers formed using a high-melting-point metal material or the barrier layers including aluminum oxide as a main component are formed between the oxide semiconductor layer including indium, gallium, and zinc and the first conductive layers including aluminum as a main component; accordingly, aluminum atoms can be prevented from being diffused into the oxide semiconductor layer. In particular, even when the oxide semiconductor layer including indium, gallium, and zinc is subjected to heat treatment, diffusion of aluminum atoms to the oxide semiconductor layer can be suppressed. In addition, electric corrosion (also referred to as electrochemical corrosion) caused between the oxide semiconductor layer including indium, gallium, and zinc and the first conductive layers including aluminum as a main component can be prevented. Therefore, a semiconductor device including a reliable thin film transistor can be provided.

Embodiment 3

In Embodiment 3, an example of electronic paper will be described as a display device which is an example of a semiconductor device according to an embodiment of the present invention.

Figure 7:
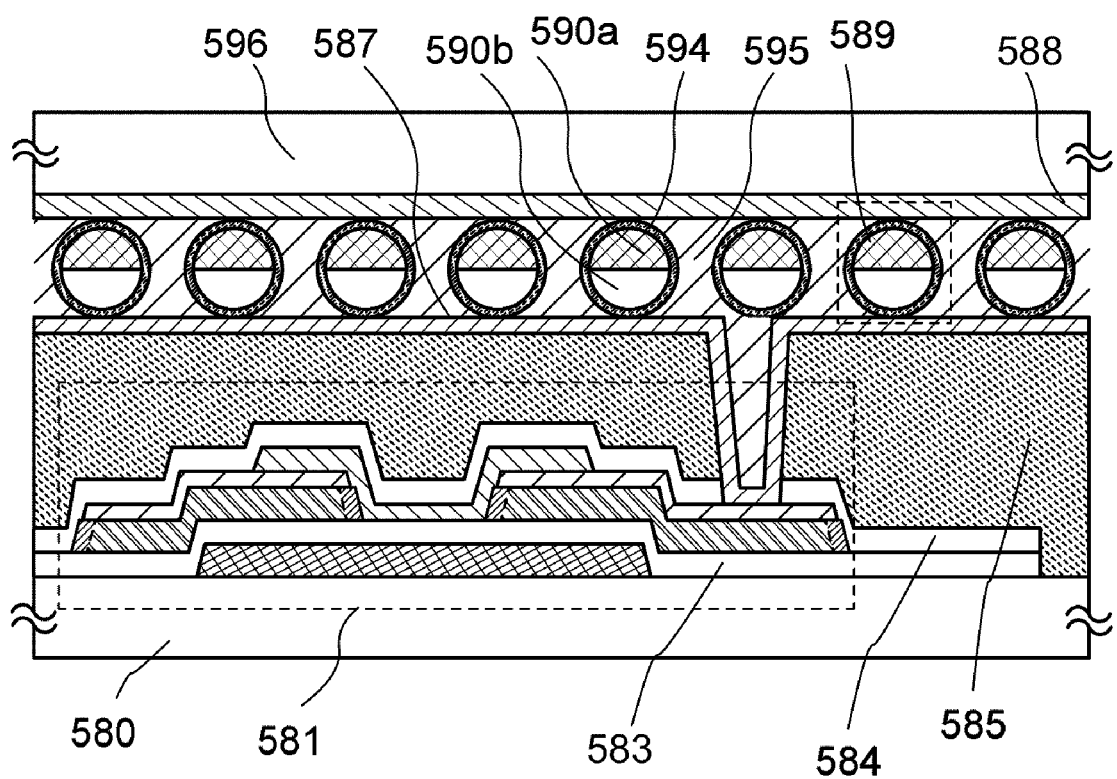
FIG. 7 is a cross-sectional view of electronic paper.

FIG. 7 illustrates active-matrix electronic paper as an example of a display device to which an embodiment of the present invention is applied. A thin film transistor 581 used in the display device can be manufactured in a manner similar to that of Embodiment 1 or 2 and has high reliability with suppression in diffusion of aluminum atoms to an oxide semiconductor layer.

The electronic paper in FIG. 7 is an example of a display device using a twisting ball display system. The twisting ball display system refers to a method in which spherical particles each colored in black and white are used for a display element and arranged between a first electrode layer and a second electrode layer which are electrode layers, and a potential difference is generated between the first electrode layer and the second electrode layer to control orientation of the spherical particles, so that display is performed.

A source electrode layer or a drain electrode layer of the thin film transistor 581 is in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 7).

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides, so that white or black can be displayed. A display element using this principle is an electrophoretic display element and is called electronic paper in general. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

In the thin film transistor described in Embodiment 1 or 2, the second conductive layers formed using a high-melting-point metal material or the barrier layers including aluminum oxide as a main component are provided between the oxide semiconductor layer including indium, gallium, and zinc and the first conductive layers including aluminum as a main component in order to suppress diffusion of aluminum atoms to the oxide semiconductor layer; thus, the thin film transistor has high reliability. Electronic paper on which the thin film transistor having high reliability is mounted has high reliability as a display element.

Embodiment 4

In Embodiment 4, examples of manufacturing at least part of a driver circuit and a thin film transistor that is arranged in a pixel portion over the same substrate in a display device which is an example of a semiconductor device according to an embodiment of the present invention will be described with reference to FIGS. 8A and 8B, FIG. 9, FIG. 10, FIG. 11, FIG. 12, and FIG. 13.

The thin film transistor arranged over the same substrate is formed in a manner similar to that of Embodiment 1 or 2. The thin film transistor formed by a method similar to that of Embodiment 1 or 2 is an n-channel TFT; therefore, among driver circuits, part of a driver circuit (driver circuits) which can be formed using an n-channel TFT is formed over the same substrate as the thin film transistor of the pixel portion.

Figure 8A:
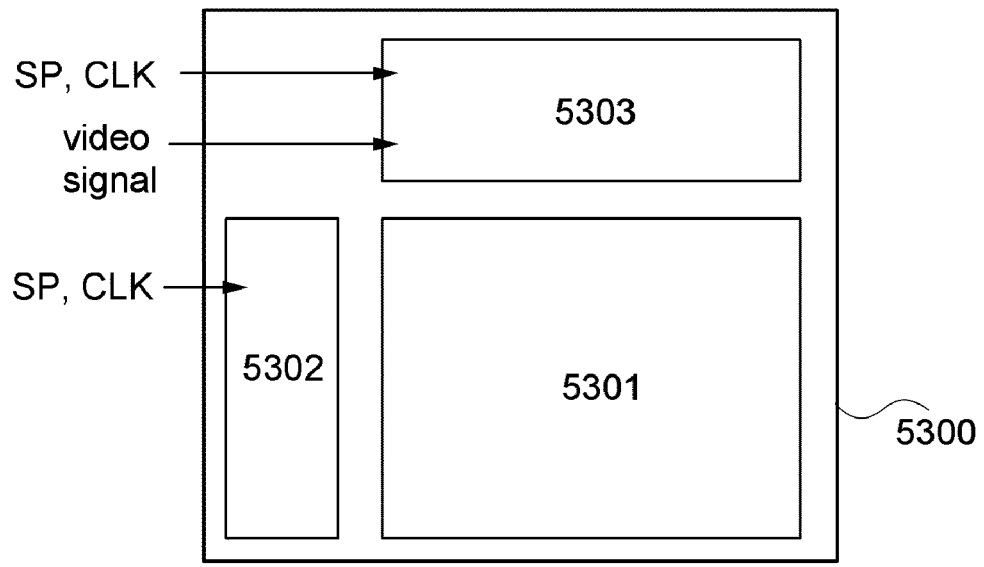
FIGS. 8A and 8B are block diagrams each showing a semiconductor device.

FIG. 8A illustrates an example of a block diagram of an active-matrix liquid crystal display device which is an example of a semiconductor device according to an embodiment of the present invention. The display device illustrated in FIG. 8A includes, over a substrate 5300, a pixel portion 5301 including a plurality of pixels that are provided with a display element; a scan line driver circuit 5302 that selects a pixel; and a signal line driver circuit 5303 that controls a video signal input to the selected pixel.

The pixel portion 5301 is connected to the signal line driver circuit 5303 by a plurality of signal lines S1 to Sm (not illustrated) that extend in a column direction from the signal line driver circuit 5303, and to the scan line driver circuit 5302 by a plurality of scan lines G1 to Gn (not illustrated) that extend in a row direction from the scan line driver circuit 5302. The pixel portion 5301 includes a plurality of pixels (not illustrated) arranged in matrix so as to correspond to the signal lines S1 to Sm and the scan lines G1 to Gn. Each pixel is connected to a signal line Sj (one of the signal lines S1 to Sm) and a scan line Gj (one of the scan lines G1 to Gn).

In addition, the thin film transistor which can be formed by a method similar to that of Embodiment 2 is an n-channel TFT, and a signal line driver circuit including the n-channel TFT will be described with reference to FIG. 9.

Figure 9:
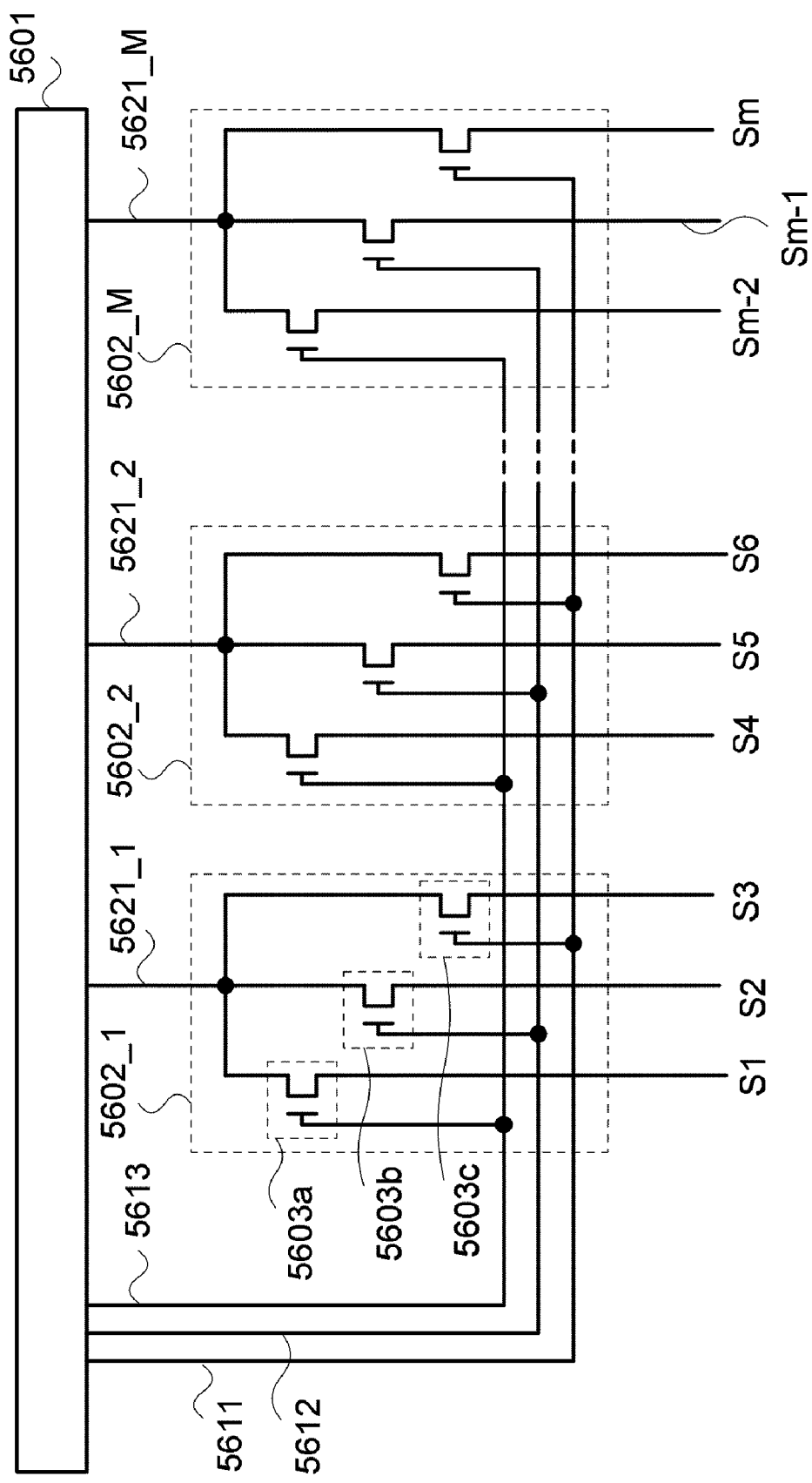
FIG. 9 shows a structure of a signal line driver circuit.

The signal line driver circuit illustrated in FIG. 9 includes a driver IC 5601, switch groups 5602_1 to 5602_M, a first wiring 5611, a second wiring 5612, a third wiring 5613, and wirings 5621_1 to 5621_M. Each of the switch groups 5602_1 to 5602_M includes a first thin film transistor 5603*a*, a second thin film transistor 5603*b*, and a third thin film transistor 5603*c*.

The driver IC 5601 is connected to the first wiring 5611, the second wiring 5612, the third wiring 5613, and the wirings 5621_1 to 5621_M. Each of the switch groups 5602_1 to 5602_M is connected to the first wiring 5611, the second wiring 5612, and the third wiring 5613, and the switch groups 5602_1 to 5602_M are connected to the wirings 5621_1 to 5621_M, respectively. Each of the wirings 5621_1 to 5621_M is connected to three signal lines via the first thin film transistor 5603*a*, the second thin film transistor 5603*b*, and the third thin film transistor 5603*c*. For example, the wiring 5621_J of the J-th column (one of the wirings 5621_1 to 5621_M) is connected to a signal line Sj−1, a signal line Sj, and a signal line Sj+1 via the first thin film transistor 5603*a*, the second thin film transistor 5603*b*, and the third thin film transistor 5603*c* included in the switch group 5602_J.

A signal is input to each of the first wiring 5611, the second wiring 5612, and the third wiring 5613.

Note that the driver IC 5601 is preferably formed over a single crystal substrate. The switch groups 5602_1 to 5602_M are preferably formed over the same substrate as the pixel portion. Therefore, the driver IC 5601 and the switch groups 5602_1 to 5602_M are preferably connected through an FPC or the like.

Figure 10:
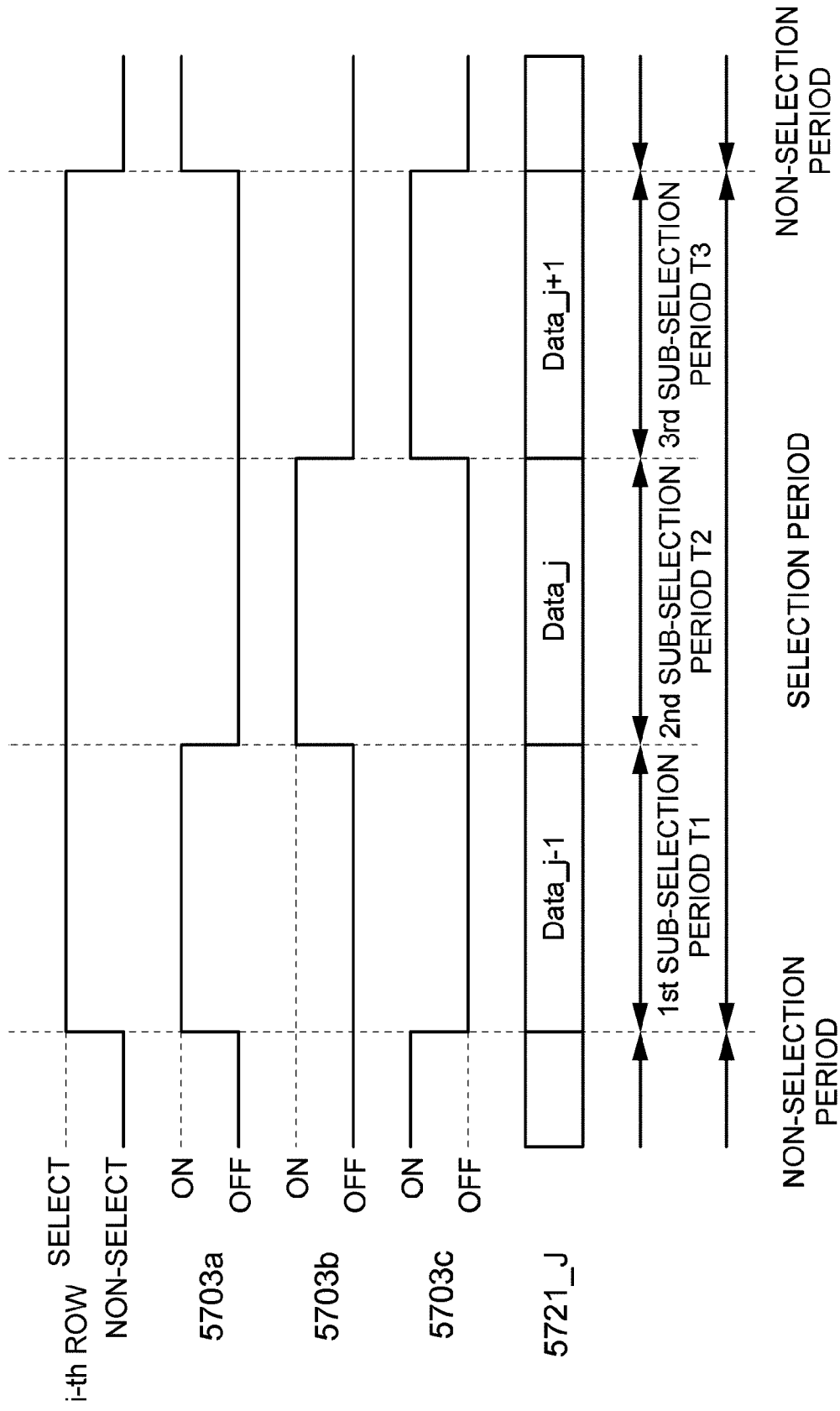
FIG. 10 is a timing chart showing operation of a signal line driver circuit.

Next, operation of the signal line driver circuit illustrated in FIG. 9 will be described with reference to a timing chart in FIG. 10. The timing chart in FIG. 10 illustrates a case where the scan line Gi of the i-th row is selected. A selection period of the scan line Gi of the i-th row is divided into a first sub-selection period T1, a second sub-selection period T2, and a third sub-selection period T3. In addition, the signal line driver circuit in FIG. 9 operates in a manner similar to that of FIG. 10 even when a scan line of another row is selected.

Note that the timing chart in FIG. 10 shows a case where the wiring 5621_J in the J-th column is connected to the signal line Sj−1, the signal line Sj, and the signal line Sj+1 via the first thin film transistor 5603a, the second thin film transistor 5603b, and the third thin film transistor 5603c.

The timing chart in FIG. 10 shows timing at which the scan line Gi of the i-th row is selected, timing 5703a of on/off of the first thin film transistor 5603a, timing 5703b of on/off of the second thin film transistor 5603b, timing 5703c of on/off of the third thin film transistor 5603c, and a signal 5721_J input to the wiring 5621_J of the J-th column.

In the first sub-selection period T1, the second sub-selection period T2, and the third sub-selection period T3, different video signals are input to the wirings 5621_1 to 5621_M. For example, a video signal input to the wiring 5621_J in the first sub-selection period T1 is input to the signal line Sj−1, a video signal input to the wiring 5621_J in the second sub-selection period T2 is input to the signal line Sj, and a video signal input to the wiring 5621_J in the third sub-selection period T3 is input to the signal line Sj+1. In addition, in the first sub-selection period T1, the second sub-selection period T2, and the third sub-selection period T3, the video signals input to the wiring 5621_J are denoted by Data_j−1, Data_j, and Data_j+1.

As illustrated in FIG. 10, in the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 9, by dividing one gate selection period into three, video signals can be input to three signal lines from one wiring 5621 in one gate selection period. Therefore, in the signal line driver circuit in FIG. 9, the number of connections between the substrate provided with the driver IC 5601 and the substrate provided with the pixel portion can be approximately ⅓ of the number of signal lines. The number of connections is reduced to approximately ⅓ of the number of the signal lines, so that reliability, yield, etc., of the signal line driver circuit in FIG. 9 can be improved.

Note that there are no particular limitations on the arrangement, the number, a driving method, and the like of the thin film transistors, as long as one gate selection period is divided into a plurality of sub-selection periods and video signals are input to a plurality of signal lines from one wiring in respective sub-selection periods as illustrated in FIG. 9.

For example, when video signals are input to three or more signal lines from one wiring in three or more sub-selection periods, it is only necessary to add a thin film transistor and a wiring for controlling the thin film transistor. Note that when one gate selection period is divided into four or more sub-selection periods, one sub-selection period becomes shorter. Therefore, one gate selection period is preferably divided into two or three sub-selection periods.

Figure 11:
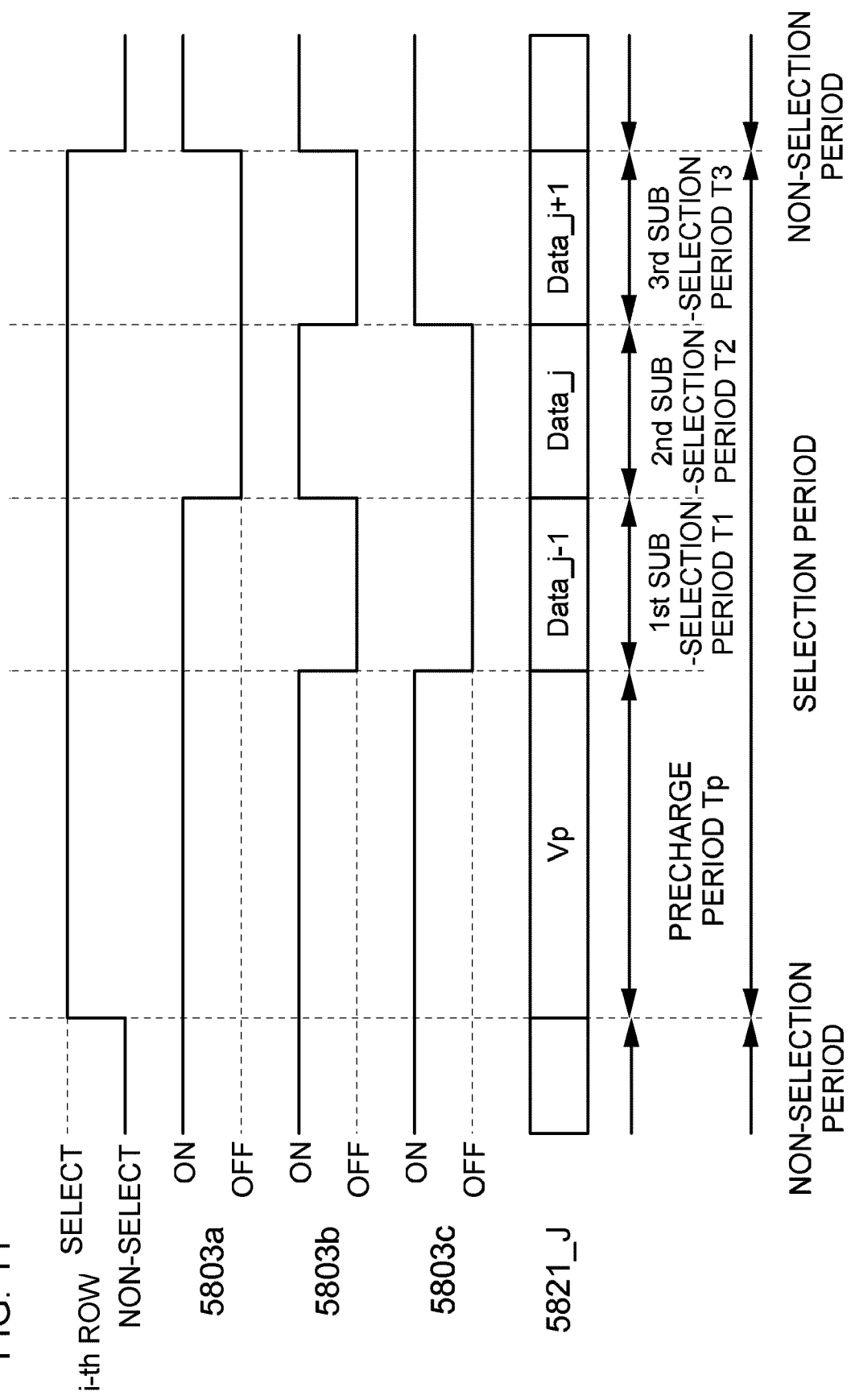
FIG. 11 is a timing chart showing operation of a signal line driver circuit.

As another example, one selection period may be divided into a precharge period Tp, the first sub-selection period T1, the second sub-selection period T2, and the third sub-selection period T3 as illustrated in a timing chart in FIG. 11. The timing chart in FIG. 11 shows timing at which the scan line Gi of the i-th row is selected, timing 5803a of on/off of the first thin film transistor 5603a, timing 5803b of on/off of the second thin film transistor 5603b, timing 5803c of on/off of the third thin film transistor 5603c, and a signal 5821_J input to the wiring 5621_J of the J-th column. As illustrated in FIG. 11, the first thin film transistor 5603a, the second thin film transistor 5603b, and the third thin film transistor 5603c are turned on in the precharge period Tp. At this time, precharge voltage Vp input to the wiring 5621_J is input to each of the signal line Sj−1, the signal line Sj, and the signal line Sj+1 via the first thin film transistor 5603a, the second thin film transistor 5603b, and the third thin film transistor 5603c. In the first sub-selection period T1, the first thin film transistor 5603a is turned on, and the second thin film transistor 5603b and the third thin film transistor 5603c are turned off. At this time, Data_j−1 input to the wiring 5621_J is input to the signal line Sj−1 via the first thin film transistor 5603a. In the second sub-selection period T2, the second thin film transistor 5603b is turned on, and the first thin film transistor 5603a and the third thin film transistor 5603c are turned off. At this time, Data_j input to the wiring 5621_J is input to the signal line Sj via the second thin film transistor 5603b. In the third sub-selection period T3, the third thin film transistor 5603c is turned on, and the first thin film transistor 5603a and the second thin film transistor 5603b are turned off. At this time, Data_j+1 input to the wiring 5621_J is input to the signal line Sj+1 via the third thin film transistor 5603c.

As described above, in the signal line driver circuit in FIG. 9 to which the timing chart in FIG. 11 is applied, the video signal can be written to the pixel at high speed because the signal line can be precharged by providing a precharge period before a sub-selection period. Note that portions in FIG. 11 which are similar to those of FIG. 10 are denoted by common reference numerals and detailed description of the portions which are the same and portions which have similar functions is omitted.

Further, a structure of a scan line driver circuit is described. The scan line driver circuit includes a shift register and a buffer. Additionally, the scan line driver circuit may include a level shifter in some cases. In the scan line driver circuit, when the clock signal (CLK) and the start pulse signal (SP) are input to the shift register, a selection signal is produced. The generated selection signal is buffered and amplified by the buffer, and the resulting signal is supplied to a corresponding scan line. Gate electrodes of transistors in pixels of one line are connected to the scan line. Further, since the transistors in the pixels of one line have to be turned on at the same time, a buffer which can feed a large current can be used.

One mode of a shift register which is used for a part of a scan line driver circuit will be described with reference to FIG. 12 and FIG. 13.

Figure 12:
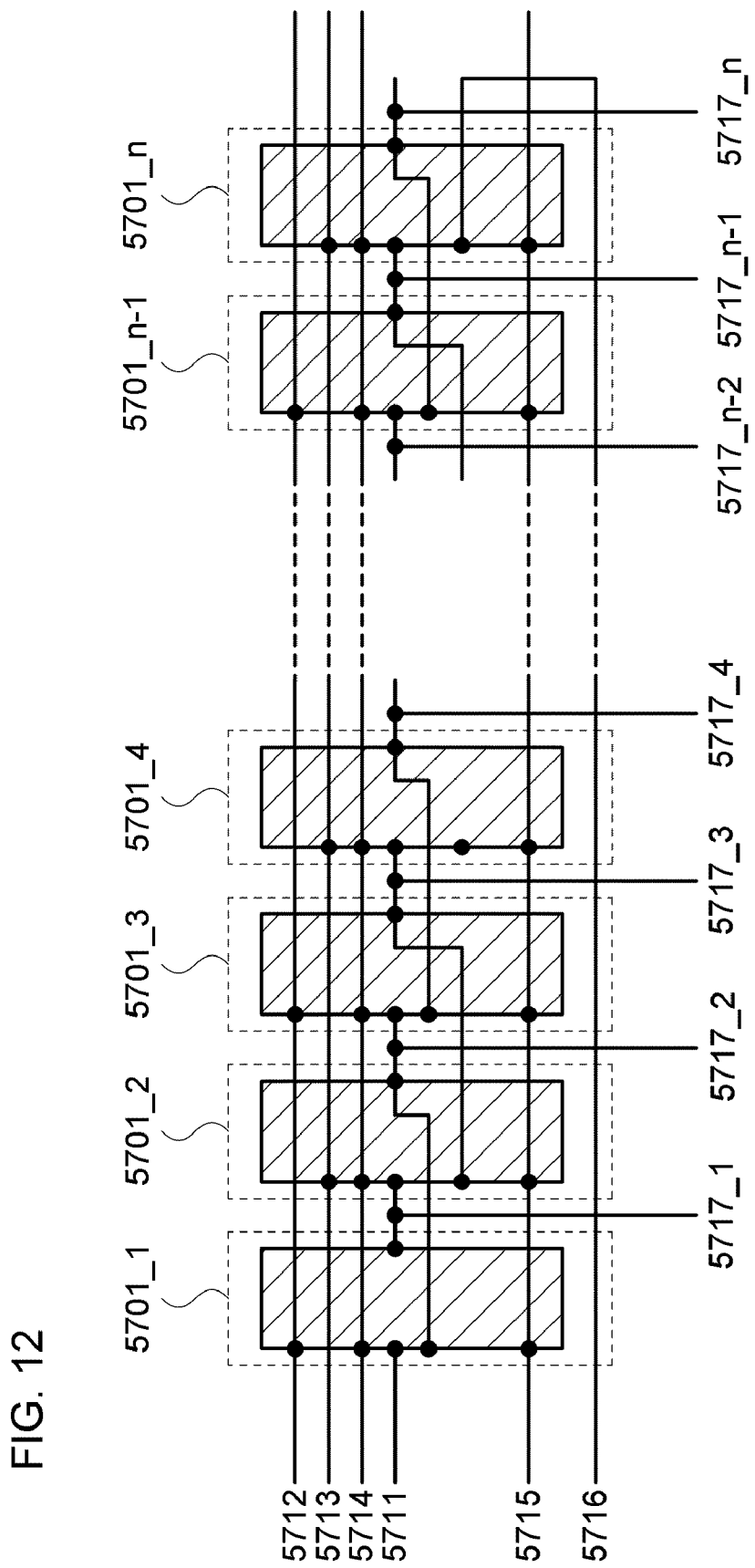
FIG. 12 shows a structure of a shift register.

FIG. 12 illustrates a circuit configuration of the shift register. The shift register illustrated in FIG. 12 includes a plurality of flip-flops such as flip-flops 5701_1 to 5701_n. The shift register is operated with input of a first clock signal, a second clock signal, a start pulse signal, and a reset signal.

Connection relations of the shift register in FIG. 12 will be described. In the i-th stage flip-flop 5701_i (one of the flip-flops 5701_1 to 5701_n) in the shift register of FIG. 12, a first wiring 5501 illustrated in FIG. 13 is connected to a seventh wiring 5717_i−1; a second wiring 5502 illustrated in FIG. 13 is connected to a seventh wiring 5717_i+1; a third wiring 5503 illustrated in FIG. 13 is connected to a seventh wiring 5717_i; and a sixth wiring 5506 illustrated in FIG. 13 is connected to a fifth wiring 5715.

Figure 13:
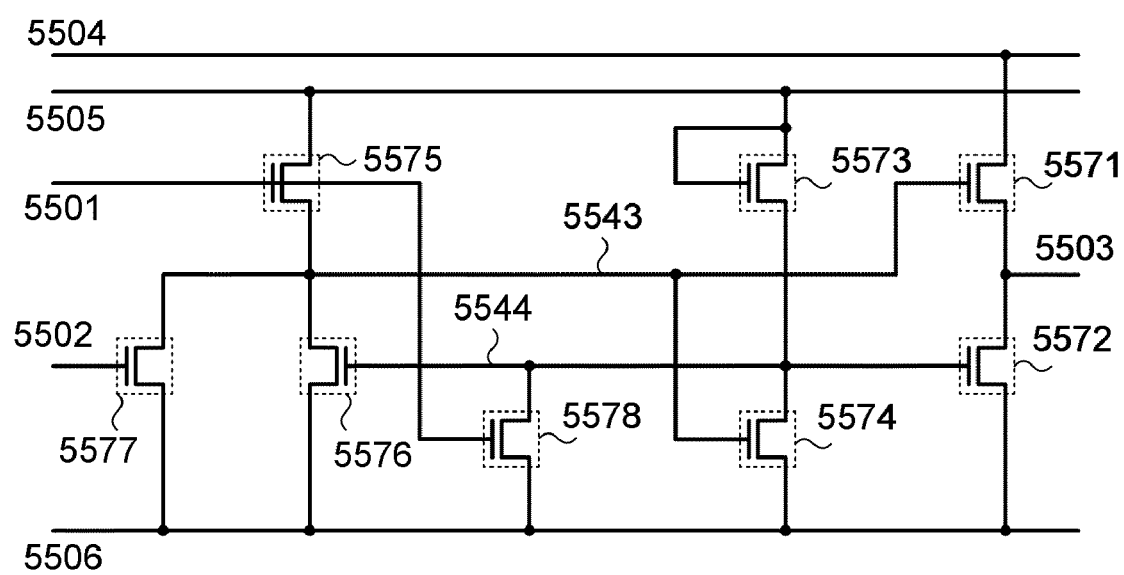
FIG. 13 shows a connection structure of a flip-flop shown in FIG. 12.

Further, a fourth wiring 5504 illustrated in FIG. 13 is connected to a second wiring 5712 in flip-flops of odd-numbered stages, and is connected to a third wiring 5713 in flip-flops of even-numbered stages. A fifth wiring 5505 illustrated in FIG. 13 is connected to a fourth wiring 5714.

Note that the first wiring 5501 of the first stage flip-flop 5701_1 illustrated in FIG. 13 is connected to a first wiring 5711. Moreover, the second wiring 5502 of the n-th stage flip-flop 5701_n illustrated in FIG. 13 is connected to a sixth wiring 5716.

Note that the first wiring 5711, the second wiring 5712, the third wiring 5713, and the sixth wiring 5716 may be referred to as a first signal line, a second signal line, a third signal line, and a fourth signal line, respectively. The fourth wiring 5714 and the fifth wiring 5715 may be referred to as a first power supply line and a second power supply line, respectively.

Next, FIG. 13 illustrates details of the flip-flop illustrated in FIG. 12. A flip-flop illustrated in FIG. 13 includes a first thin film transistor 5571, a second thin film transistor 5572, a third thin film transistor 5573, a fourth thin film transistor 5574, a fifth thin film transistor 5575, a sixth thin film transistor 5576, a seventh thin film transistor 5577, and an eighth thin film transistor 5578. Each of the first thin film transistor 5571, the second thin film transistor 5572, the third thin film transistor 5573, the fourth thin film transistor 5574, the fifth thin film transistor 5575, the sixth thin film transistor 5576, the seventh thin film transistor 5577, and the eighth thin film transistor 5578 is an n-channel transistor and is turned on when the gate-source voltage ($V_{gs}$) exceeds the threshold voltage ($V_{th}$).

Next, connection structures of the flip-flop illustrated in FIG. 13 will be described below.

A first electrode (one of a source electrode and a drain electrode) of the first thin film transistor 5571 is connected to the fourth wiring 5504. A second electrode (the other of the source electrode and the drain electrode) of the first thin film transistor 5571 is connected to the third wiring 5503.

A first electrode of the second thin film transistor 5572 is connected to the sixth wiring 5506. A second electrode of the second thin film transistor 5572 is connected to the third wiring 5503.

A first electrode of the third thin film transistor 5573 is connected to the fifth wiring 5505. A second electrode of the third thin film transistor 5573 is connected to a gate electrode of the second thin film transistor 5572. A gate electrode of the third thin film transistor 5573 is connected to the fifth wiring 5505.

A first electrode of the fourth thin film transistor 5574 is connected to the sixth wiring 5506 and a second electrode of the fourth thin film transistor 5574 is connected to the gate electrode of the second thin film transistor 5572. A gate electrode of the fourth thin film transistor 5574 is connected to a gate electrode of the first thin film transistor 5571.

A first electrode of the fifth thin film transistor 5575 is connected to the fifth wiring 5505. A second electrode of the fifth thin film transistor 5575 is connected to the gate electrode of the first thin film transistor 5571. A gate electrode of the fifth thin film transistor 5575 is connected to the first wiring 5501.

A first electrode of the sixth thin film transistor 5576 is connected to the sixth wiring 5506. A second electrode of the sixth thin film transistor 5576 is connected to the gate electrode of the first thin film transistor 5571. A gate electrode of the sixth thin film transistor 5576 is connected to the gate electrode of the second thin film transistor 5572.

A first electrode of the seventh thin film transistor 5577 is connected to the sixth wiring 5506. A second electrode of the seventh thin film transistor 5577 is connected to the gate electrode of the first thin film transistor 5571. A gate electrode of the seventh thin film transistor 5577 is connected to the second wiring 5502. A first electrode of the eighth thin film transistor 5578 is connected to the sixth wiring 5506. A second electrode of the eighth thin film transistor 5578 is connected to the gate electrode of the second thin film transistor 5572. A gate electrode of the eighth thin film transistor 5578 is connected to the first wiring 5501.

Note that the point at which the gate electrode of the first thin film transistor 5571, the gate electrode of the fourth thin film transistor 5574, the second electrode of the fifth thin film transistor 5575, the second electrode of the sixth thin film transistor 5576, and the second electrode of the seventh thin film transistor 5577 are connected is referred to as a node 5543. The point at which the gate electrode of the second thin film transistor 5572, the second electrode of the third thin film transistor 5573, the second electrode of the fourth thin film transistor 5574, the gate electrode of the sixth thin film transistor 5576, and the second electrode of the eighth thin film transistor 5578 are connected is referred to as a node 5544.

Note that the first wiring 5501, the second wiring 5502, the third wiring 5503, and the fourth wiring 5504 may be referred to as a first signal line, a second signal line, a third signal line, and a fourth signal line, respectively. The fifth wiring 5505 and the sixth wiring 5506 may be referred to as a first power supply line and a second power supply line, respectively.

In addition, the signal line driver circuit and the scan line driver circuit can be formed using only the n-channel TFTs which can be formed by a method similar to that of Embodiment 2. The n-channel TFT which can be formed by a method similar to that of Embodiment 2 has a high mobility, and thus a driving frequency of a driver circuit can be increased. For example, a scan line driver circuit using the n-channel TFT which can be formed by a method similar to that of Embodiment 2 can operate at high speed, and thus a frame frequency can be increased and insertion of black images can be realized.

In addition, when the channel width of the transistor in the scan line driver circuit is increased or a plurality of scan line driver circuits are provided, for example, higher frame frequency can be realized. When a plurality of scan line driver circuits are provided, a scan line driver circuit for driving even-numbered scan lines is provided on one side and a scan line driver circuit for driving odd-numbered scan lines is provided on the opposite side; thus, increase in frame frequency can be realized. Further, it is advantageous that signals be outputted to the same scan line from a plurality of scan line driver circuits in terms of increase in size of a display device.

Figure 8B:
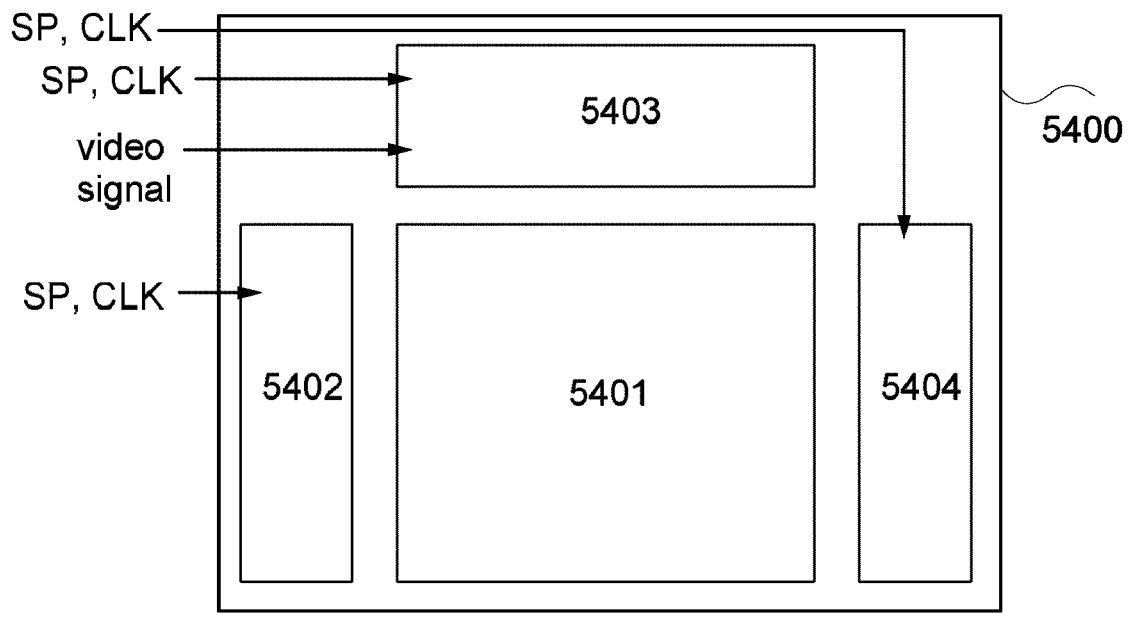

Further, when an active-matrix light-emitting display device, which is an example of a semiconductor device to which an embodiment of the present invention is applied, is manufactured, a plurality of thin film transistors are arranged in at least one pixel, and thus a plurality of scan line driver circuits are preferably arranged. FIG. 8B is a block diagram illustrating an example of an active-matrix light-emitting display device.

The light-emitting display device illustrated in FIG. 8B includes, over a substrate 5400, a pixel portion 5401 having a plurality of pixels provided with a display element, a first scan line driver circuit 5402 and a second scan line driver circuit 5404 which select a pixel, and a signal line driver circuit 5403 which controls input of a video signal to the selected pixel.

When the video signal input to a pixel of the light-emitting display device illustrated in FIG. 8B is a digital signal, a pixel emits light or does not emit light by switching of on/off of a transistor. Thus, grayscale can be displayed using an area ratio grayscale method or a time ratio grayscale method. An area ratio grayscale method refers to a driving method by which one pixel is divided into a plurality of subpixels and the respective subpixels are driven independently based on video signals so that grayscale is displayed. Further, a time ratio grayscale method refers to a driving method by which a period during which a pixel is in a light-emitting state is controlled so that grayscale is displayed.

Since the response speed of light-emitting elements is higher than that of liquid crystal elements or the like, the light-emitting elements are more suitable for a time ratio grayscale method than the liquid-crystal display elements. Specifically, in the case of displaying by a time ratio grayscale method, one frame period is divided into a plurality of subframe periods. Then, in accordance with video signals, the light-emitting element in the pixel is set in a light-emitting state or a non-light-emitting state in each subframe period. By dividing one frame into a plurality of subframe periods, the total length of time, in which pixels actually emit light, in one frame period can be controlled with video signals, so that grayscale can be displayed.

The light-emitting display device illustrated in FIG. 8B is an example in the case of arranging two switching TFTs in one pixel, where the first scan line driver circuit 5402 generates a signal which is input to a first scan line serving as a gate wiring of one of the switching TFTs, and the second scan line driver circuit 5404 generates a signal which is input to a second scan line serving as a gate wiring of the other switching TFT. However, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of switching TFTs included in one pixel. In that case, one scan line driver circuit may generate all signals that are input to the plurality of scan lines, or a plurality of scan line driver circuits may generate signals that are input to the plurality of first scan lines.

In addition, also in the light-emitting display device, among driver circuits, part of the driver circuit(s) which can be formed using an n-channel TFT can be formed over the same substrate as the thin film transistor of the pixel portion. Alternatively, the signal line driver circuit and the scan line driver circuit can be formed using only n-channel TFTs which can be formed by a method similar to that of Embodiment 2.

Moreover, the above-described driver circuit can be used for electronic paper that drives electronic ink using an element electrically connected to a switching element, without being limited to applications to a liquid crystal display device or a light-emitting display device. The electronic paper is also referred to as an electrophoretic display device (electrophoretic display) and has advantages in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules are moved in opposite directions to each other and only the color of the particles concentrated on one side is exhibited. It is to be noted that the first particles and the second particles each contain pigment and do not move without an electric field. Moreover, the colors of the first particles and the second particles are different from each other (the colors include colorless or achroma).

In this way, an electrophoretic display is a display that utilizes a so-called dielectrophoretic effect by which a substance that has a high dielectric constant moves to a high-electric field region. An electrophoretic display does not need to use a polarizer and a counter substrate, which are required in a liquid crystal display device, and both the thickness and weight of the electrophoretic display device can be a half of those of a liquid crystal display device.

A solution in which the aforementioned microcapsules are dispersed in a solvent is referred to as electronic ink. This electronic ink can be printed on a surface of glass, plastic, cloth, paper, or the like. Furthermore, with the use of a color filter or particles including a coloring matter, color display is possible, as well.

In addition, if a plurality of the aforementioned microcapsules are arranged as appropriate over an active-matrix substrate so as to be interposed between two electrodes, an active-matrix display device can be completed, and display can be performed by application of an electric field to the microcapsules. For example, an active-matrix substrate obtained using the thin film transistor which can be formed by a method similar to that of Embodiment 2 can be used.

It is to be noted that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, or a magnetophoretic material or formed of a composite material of any of these.

In the thin film transistor described in Embodiment 1 or 2, the second conductive layers formed using a high-melting-point metal material or the barrier layers including aluminum oxide as a main component are provided between the oxide semiconductor layer including indium, gallium, and zinc and the first conductive layers including aluminum as a main component in order to suppress diffusion of aluminum atoms to the oxide semiconductor layer; thus, the thin film transistor has high reliability. Through the above-described process, a highly reliable display device provided with a reliable thin film transistor in which diffusion of aluminum atoms to the oxide semiconductor layer is suppressed can be manufactured. Note that this embodiment can be implemented in combination with any of the structures described in other embodiments, as appropriate.

Embodiment 5

When a thin film transistor of one embodiment of the present invention is manufactured and used for a pixel portion and further for a driver circuit, a semiconductor device having a display function (also referred to as a display device) can be manufactured. Furthermore, when part or whole of a driver circuit using a thin film transistor of one embodiment of the present invention is formed over the same substrate as a pixel portion, a system-on-panel can be obtained.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by current or voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by chip on glass (COG).

Figures 1, 14A:
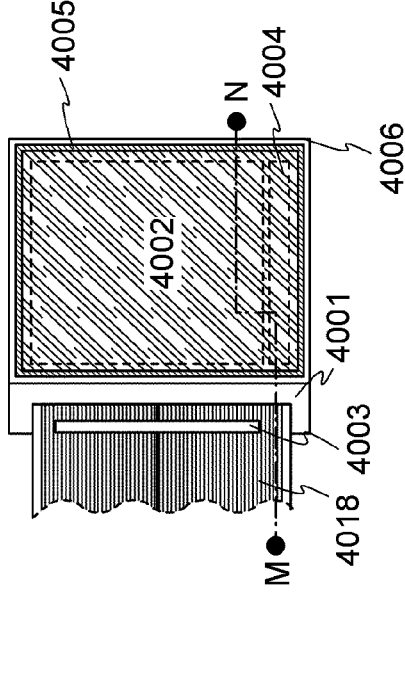
FIGS. 14A-1 and 14A-2 are top views illustrating semiconductor devices and FIG. 14B is a cross-sectional view thereof.
Figures 2, 14A:
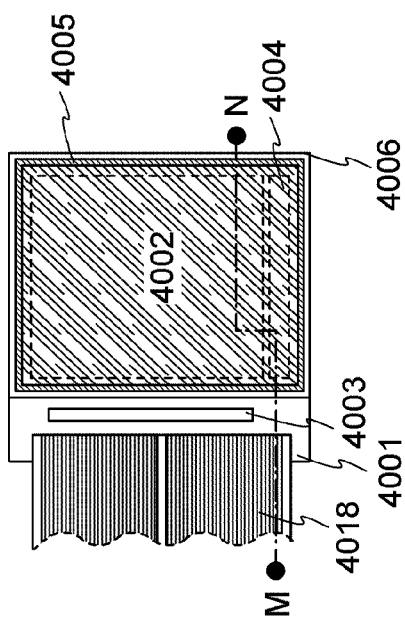
Figure 14B:
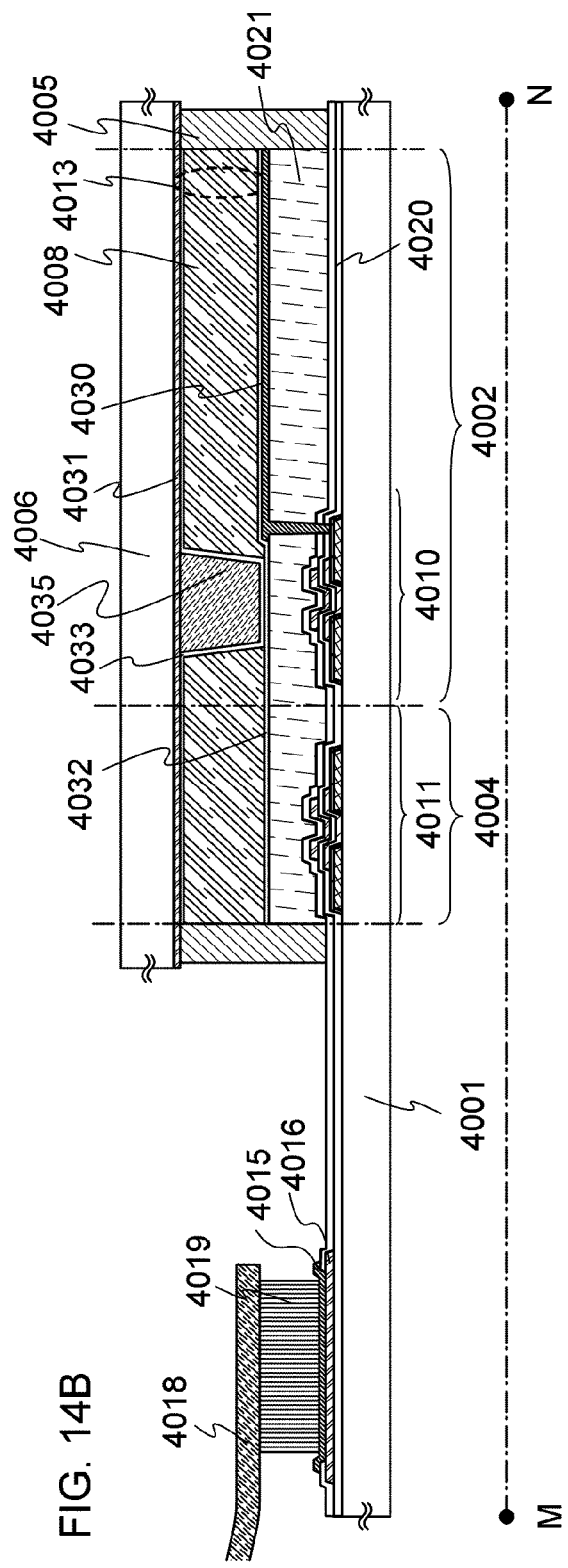

In this embodiment, the appearance and a cross section of a liquid crystal display panel, which is one mode of the semiconductor device according to an embodiment of the present invention, will be described with reference to FIGS. 14A-1, 14A-2 and FIG. 14B. FIGS. 14A-1 and 14A-2 are top views of a panel in which thin film transistors 4010 and 4011 with high electric characteristics, in each of which second conductive layers formed using a high-melting-point metal material or barrier layers including aluminum oxide as a main component are provided between an oxide semiconductor layer including indium, gallium, and zinc and first conductive layers including aluminum as a main component in order to suppress diffusion of aluminum atoms to the oxide semiconductor layer, and a liquid crystal element 4013 are sealed between a first substrate 4001 and a second substrate 4006 with a sealant 4005. FIG. 14B is a cross-sectional view taken along line M-N of FIGS. 14A-1 and 14A-2.

The sealant 4005 is provided to surround a pixel portion 4002 and a scanning line driver circuit 4004 that are provided over the first substrate 4001. The second substrate 4006 is provided over the pixel portion 4002 and the scanning line driver circuit 4004. Therefore, the pixel portion 4002 and the scanning line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region different from the region surrounded by the sealant 4005 over the first substrate 4001.

Note that there is no particular limitation on the connection method of a driver circuit which is separately formed, and COG, wire bonding, TAB, or the like can be used. FIG. 14A-1 illustrates an example of mounting the signal line driver circuit 4003 by COG, and FIG. 14A-2 illustrates an example of mounting the signal line driver circuit 4003 by TAB.

The pixel portion 4002 and the scanning line driver circuit 4004 provided over the first substrate 4001 each include a plurality of thin film transistors. FIG. 14B illustrates the thin film transistor 4010 included in the pixel portion 4002 and the thin film transistor 4011 included in the scanning line driver circuit 4004. Insulating layers 4020 and 4021 are provided over the thin film transistors 4010 and 4011.

Each of the thin film transistors 4010 and 4011 corresponds to a reliable thin film transistor in which diffusion of aluminum atoms to an oxide semiconductor layer is suppressed, and any of the thin film transistors described in Embodiments 1 and 2 can be used as the thin film transistors 4010 and 4011. In this embodiment, the thin film transistors 4010 and 4011 are n-channel thin film transistors.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010 through conductive particles. Note that the conductive particles are contained in the sealant 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperature, a liquid crystal composition containing a chiral agent at 5 wt % or more is used for the liquid crystal layer 4008 in order to improve the temperature range. The liquid crystal composition which includes a liquid crystal showing a blue phase and a chiral agent has a short response time of 10 μs to 100 μs, has optical isotropy, which makes the alignment process unneeded, and has a small viewing angle dependence.

Although an example of a transmissive liquid crystal display device is shown in this embodiment, an embodiment of the present invention can also be applied to a reflective liquid crystal display device or a transflective liquid crystal display device.

In this embodiment, an example of the liquid crystal display device is shown in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked structure of the polarizing plate and the coloring layer is not limited to that shown in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor obtained by Embodiment 1 or 2 is covered with the insulating layers (the insulating layer 4020 and the insulating layer 4021) serving as a protective film or a planarizing insulating film. Note that the protective film is provided to prevent entry of impurities floating in air, such as an organic substance, a metal substance, or moisture, and is preferably a dense film. The protective film may be formed by a sputtering method to be a single-layer film or a multi-layer film of a silicon oxide film, a silicon nitride film, a silicon oxynitride film, a silicon nitride oxide film, an aluminum oxide film, an aluminum nitride film, an aluminum oxynitride film, and/or an aluminum nitride oxide film. Although this embodiment shows an example of forming the protective film by a sputtering method, the present invention is not limited to this method and a variety of methods may be employed.

In this embodiment, the insulating layer 4020 having a multi-layer structure is formed as the protective film. As a first layer of the insulating layer 4020, a silicon oxide film is formed by a sputtering method. The use of the silicon oxide film as the protective film has an effect of preventing a hillock of an aluminum film used for the source or drain electrode layers.

The insulating layer is also formed as a second layer of the protective film. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electric characteristics of the TFT.

After the protective film is formed, the oxide semiconductor layer including indium, gallium, and zinc may be annealed (at 300° C. to 400° C.).

The insulating layer 4021 is formed as the planarizing insulating film. For the insulating layer 4021, an organic material having heat resistance, such as polyimide, acrylic, polyimide, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include as a substituent an organic group (e.g., an alkyl group or an aryl group) or a fluoro group. The organic group may include a fluoro group. Note that the insulating layer 4021 may be formed by stacking a plurality of insulating films formed of these materials.

Note that a siloxane-based resin is a resin formed from a siloxane material as a starting material and having the bond of Si—O—Si.

There is no particular limitation on the method for forming the insulating layer 4021, and the insulating layer 4021 can be formed, depending on the material, by sputtering, SOG, spin coating, dipping, spray coating, droplet discharging (e.g., ink-jet, screen printing, or offset printing), doctor knife, roll coater, curtain coater, knife coater, or the like. In the case where the insulating layer 4021 is formed using a material solution, the oxide semiconductor layer including indium, gallium, and zinc may be annealed (at 300° C. to 400° C.) at the same time of a baking step. The baking step of the insulating layer 4021 also serves as the annealing step of the oxide semiconductor layer including indium, gallium, and zinc, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the pixel electrode layer 4030 and the counter electrode layer 4031. The pixel electrode made of the conductive composition preferably has a sheet resistance of 10000 ohms per square or less and a transmittance of 70% or more at a wavelength of 550 nm. Furthermore, the resistivity of the conductive high molecule contained in the conductive composition is preferably 0.1Ω·cm or less.

As the conductive high molecule, a so-called π-electron conjugated conductive polymer can be used. For example, it is possible to use polyaniline or a derivative thereof, polypyrrole or a derivative thereof, polythiophene or a derivative thereof, or a copolymer of two or more kinds of them.

In addition, a variety of signals and a potential are supplied to the signal line driver circuit 4003 that is formed separately, and the scanning line driver circuit 4004 or the pixel portion 4002 from an FPC 4018.

In this embodiment, a connecting terminal electrode 4015 is formed using the same conductive film as that of the pixel electrode layer 4030 included in the liquid crystal element 4013, and a terminal electrode 4016 is formed using the same conductive film as that of source or drain electrode layers of the thin film transistors 4010 and 4011.

The connecting terminal electrode 4015 is electrically connected to a terminal included in the FPC 4018 through an anisotropic conductive film 4019.

Note that FIGS. 14A-1 and 14A-2 and FIG. 14B illustrate an example in which the signal line driver circuit 4003 is formed separately and mounted on the first substrate 4001; however, this embodiment is not limited to this structure. The scanning line driver circuit may be separately formed and then mounted, or only part of the signal line driver circuit or part of the scanning line driver circuit may be separately formed and then mounted.

Figure 15:
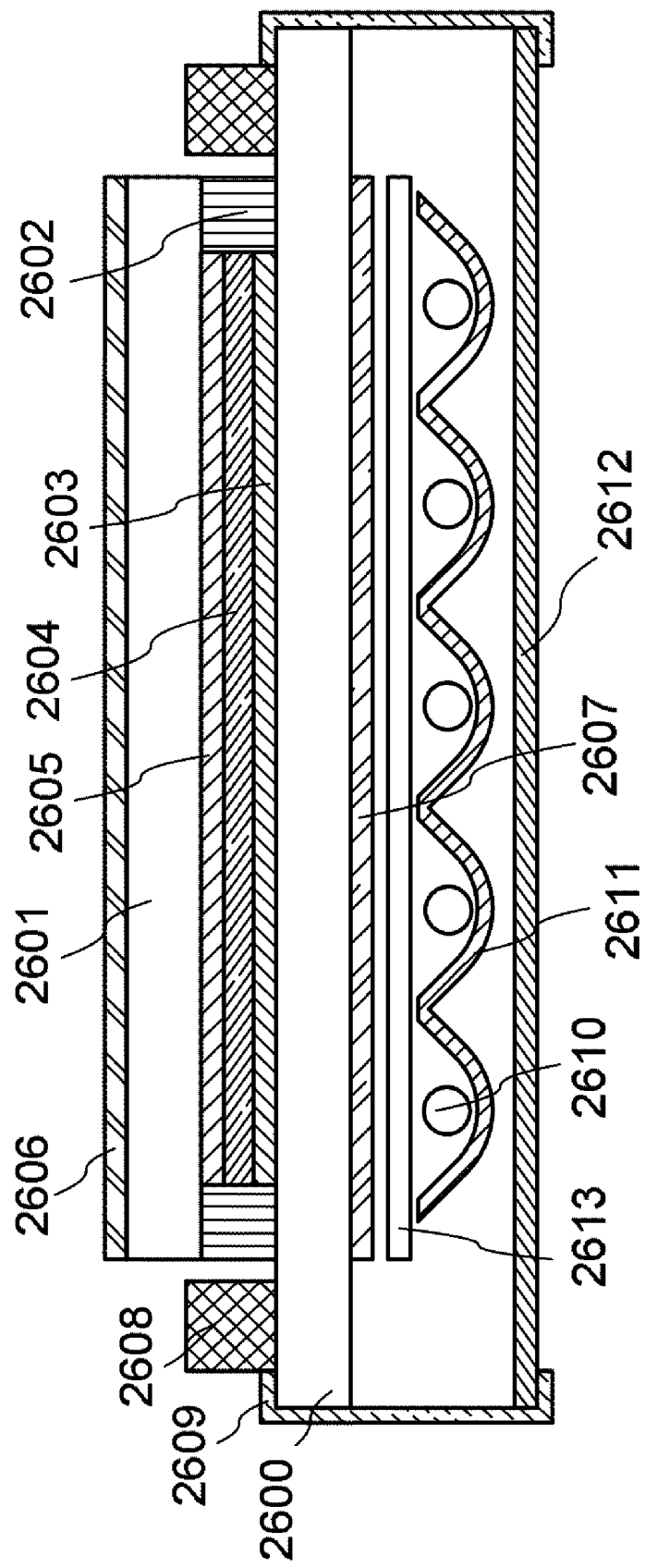
FIG. 15 is a cross-sectional view of a semiconductor device.

FIG. 15 illustrates an example of a liquid crystal display module which is formed as a semiconductor device by using a TFT substrate 2600 manufactured using an embodiment of the present invention.

FIG. 15 illustrates an example of a liquid crystal display module, in which the TFT substrate 2600 and a counter substrate 2601 are bonded to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

In the thin film transistor described in Embodiment 1 or 2, the second conductive layers formed using a high-melting-point metal material or the barrier layers including aluminum oxide as a main component are provided between the oxide semiconductor layer including indium, gallium, and zinc and the first conductive layers including aluminum as a main component in order to suppress diffusion of aluminum atoms to the oxide semiconductor layer; thus, the thin film transistor has high reliability. Through the above-described process, a highly reliable liquid crystal display panel can be manufactured using a highly reliable thin film transistor.

This embodiment can be implemented in combination with any of the structures described in other embodiments, as appropriate.

Embodiment 6

In this embodiment, an example of a light-emitting display device will be described as a semiconductor device of one embodiment of the present invention. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) are recombined, so that the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 16:
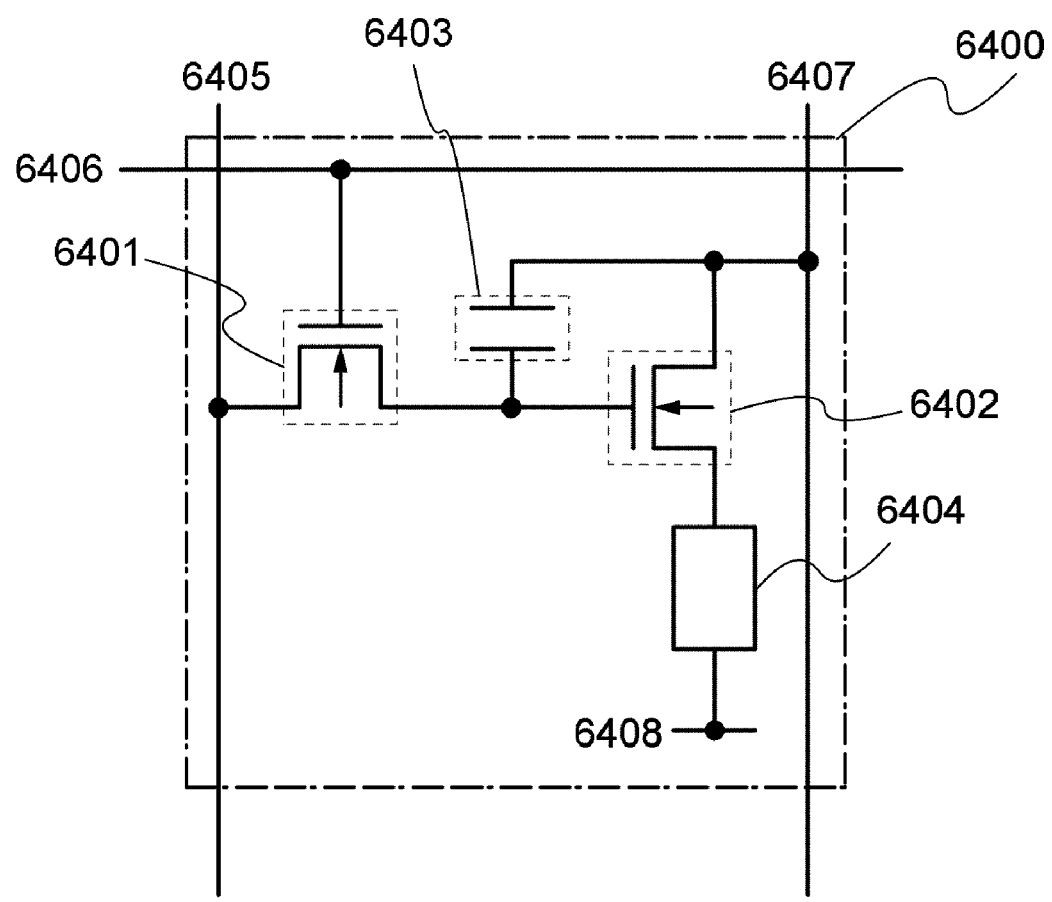
FIG. 16 is an equivalent circuit diagram of a pixel in a semiconductor device.

FIG. 16 illustrates an example of a pixel structure which can be driven by a digital time grayscale method, as an example of a semiconductor device to which an embodiment of the present invention is applied.

The structure and operation of a pixel which can be driven by a digital time grayscale method will be described. An example is shown here in which one pixel includes two n-channel transistors that use an oxide semiconductor layer including indium, gallium, and zinc described in Embodiment 1 or 2 in a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. The low power supply potential is lower than a high power supply potential which is supplied to the power supply line 6407. For example, GND or 0 V may be set as the low power supply potential. The difference between the high power supply potential and the low power supply potential is applied to the light-emitting element 6404 to flow current in the light-emitting element 6404, whereby the light-emitting element 6404 emits light. Thus, each potential is set so that the difference between the high power supply potential and the low power supply potential is higher than or equal to a forward threshold voltage of the light-emitting element 6404.

When the gate capacitance of the driving transistor 6402 is used as a substitute for the capacitor 6403, the capacitor 6403 can be omitted. The gate capacitance of the driving transistor 6402 may be formed between a channel region and a gate electrode.

In the case of using a voltage-input voltage driving method, a video signal is input to the gate of the driving transistor 6402 to make the driving transistor 6402 completely turn on or off. That is, the driving transistor 6402 operates in a linear region, and thus, a voltage higher than the voltage of the power supply line 6407 is applied to the gate of the driving transistor 6402. Note that a voltage higher than or equal to (power supply line voltage+$V_{th}$ of the driving transistor 6402) is applied to the signal line 6405.

In the case of using an analog grayscale method instead of the digital time grayscale method, the same pixel structure as in FIG. 16 can be employed by inputting signals in a different way.

In the case of using the analog grayscale method, a voltage higher than or equal to (forward voltage of the light-emitting element 6404+$V_{th}$ of the driving transistor 6402) is applied to the gate of the driving transistor 6402. The forward voltage of the light-emitting element 6404 refers to a voltage to obtain a desired luminance, and includes at least a forward threshold voltage. By inputting a video signal to allow the driving transistor 6402 to operate in a saturation region, current can flow in the light-emitting element 6404. In order to allow the driving transistor 6402 to operate in the saturation region, the potential of the power supply line 6407 is higher than a gate potential of the driving transistor 6402. Since the video signal is an analog signal, a current in accordance with the video signal flows in the light-emitting element 6404, and the analog grayscale method can be performed.

Note that the pixel structure is not limited to that illustrated in FIG. 16. For example, the pixel in FIG. 16 can further include a switch, a resistor, a capacitor, a transistor, a logic circuit, or the like.

Next, structures of the light-emitting element will be described with reference to FIGS. 17A to 17C. A cross-sectional structure of a pixel will be described by taking an n-channel driving TFT as an example. Driving TFTs 7001, 7011, and 7021 used for semiconductor devices illustrated in FIGS. 17A to 17C can be manufactured in a manner similar to the thin film transistor described in Embodiment 1 or 2 and are highly reliable thin film transistors in each of which second conductive layers formed using a high-melting-point metal material or barrier layers including aluminum oxide as a main component are provided between an oxide semiconductor layer including indium, gallium, and zinc and first conductive layers including aluminum as a main component in order to suppress diffusion of aluminum atoms to the oxide semiconductor layer.

In order to extract light emitted from the light-emitting element, at least one of the anode and the cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure of an embodiment of the present invention can be applied to a light-emitting element having any of these emission structures.

A light-emitting element having a top emission structure will be described with reference to FIG. 17A.

Figure 17A:
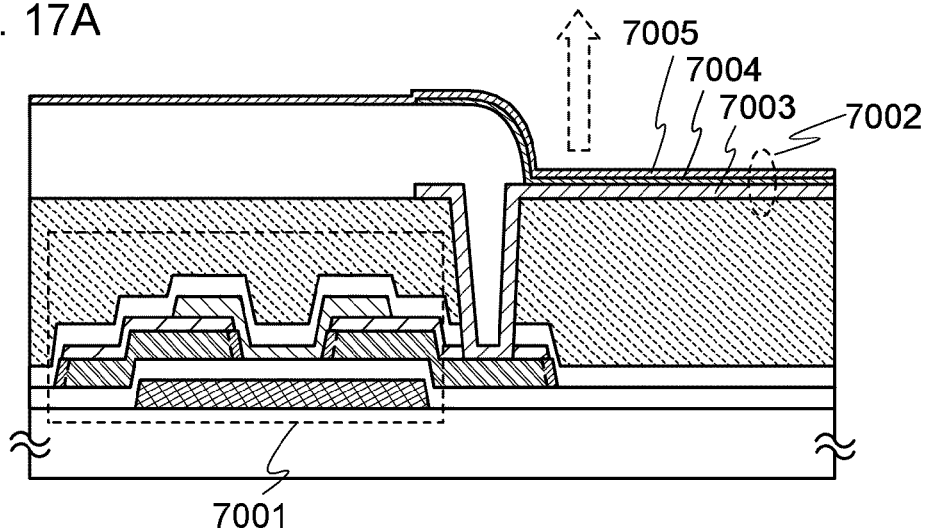
FIGS. 17A to 17C illustrate semiconductor devices.

FIG. 17A is a cross-sectional view of a pixel in the case where the driving TFT 7001 is of an n-type and light is emitted from a light-emitting element 7002 to an anode 7005 side. In FIG. 17A, a cathode 7003 of the light-emitting element 7002 is electrically connected to the driving TFT 7001, and a light-emitting layer 7004 and the anode 7005 are stacked in this order over the cathode 7003. The cathode 7003 can be made of a variety of conductive materials as long as they have a low work function and reflect light. For example, Ca, Al, CaF, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Not all of these layers need to be provided. The anode 7005 is made of a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the case of the pixel illustrated in FIG. 17A, light is emitted from the light-emitting element 7002 to the anode 7005 side as indicated by an arrow.

Next, a light-emitting element having a bottom emission structure will be described with reference to FIG. 17B. FIG. 17B is a cross-sectional view of a pixel in the case where the driving TFT 7011 is of an n-type and light is emitted from a light-emitting element 7012 to a cathode 7013 side. In FIG. 17B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used, like in the case of FIG. 17A, as long as they are conductive materials having a low work function. Note that the cathode 7013 is formed to have a thickness that can transmit light (preferably, approximately 5 nm to 30 nm). For example, an aluminum film with a thickness of 20 nm can be used as the cathode 7013. Similarly to the case of FIG. 17A, the light-emitting layer 7014 may be formed using either a single layer or a plurality of layers stacked. The anode 7015 is not required to transmit light, but can be made of a light-transmitting conductive material like in the case of FIG. 17A. As the light-blocking film 7016, a metal which reflects light can be used for example; however, it is not limited to a metal film. For example, a resin to which black pigments are added can also be used.

The light-emitting element 7012 corresponds to a region where the cathode 7013 and the anode 7015 sandwich the light-emitting layer 7014. In the case of the pixel illustrated in FIG. 17B, light is emitted from the light-emitting element 7012 to the cathode 7013 side as indicated by an arrow.

Next, a light-emitting element having a dual emission structure will be described with reference to FIG. 17C. In FIG. 17C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. Like in the case of FIG. 17A, the cathode 7023 can be made of a variety of conductive materials as long as they have a low work function. Note that the cathode 7023 is formed to have a thickness that can transmit light. For example, a film of Al having a thickness of 20 nm can be used as the cathode 7023. Like in FIG. 17A, the light-emitting layer 7024 may be formed using either a single layer or a plurality of layers stacked. The anode 7025 can be made of a light-transmitting conductive material like in the case of FIG. 17A.

The light-emitting element 7022 corresponds to a region where the cathode 7023, the light-emitting layer 7024, and the anode 7025 overlap with one another. In the case of the pixel illustrated in FIG. 17C, light is emitted from the light-emitting element 7022 to both the anode 7025 side and the cathode 7023 side as indicated by arrows.

Although an organic EL element is described here as a light-emitting element, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 17B:
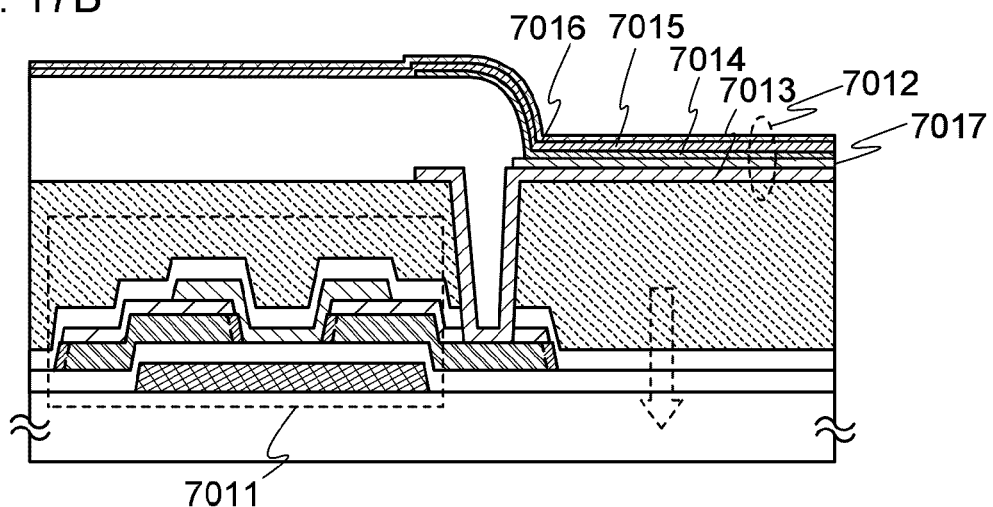
Figure 17C:
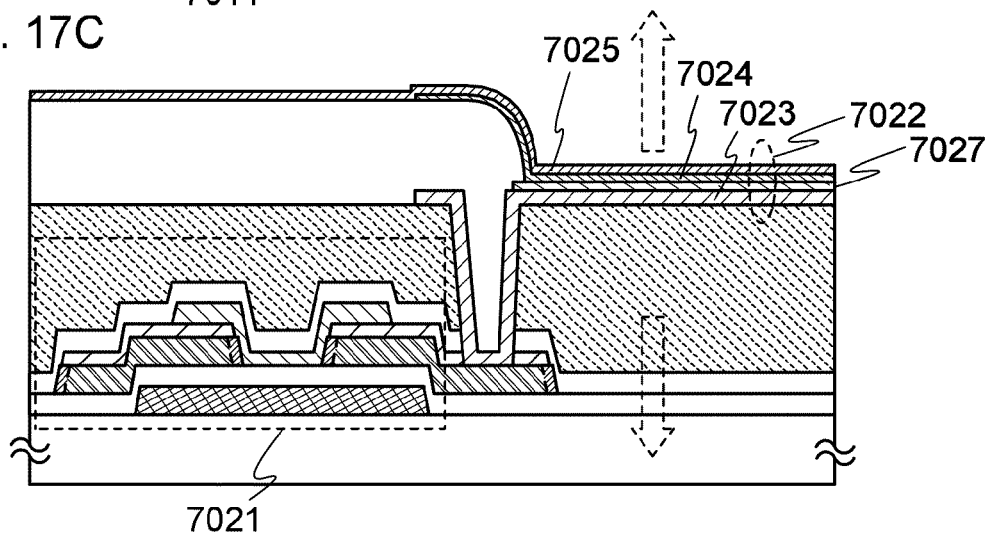

The structure of the semiconductor device described in this embodiment is not limited to those illustrated in FIGS. 17A to 17C and can be modified in various ways based on the spirit of techniques of an embodiment of the present invention.

Figure 18A:
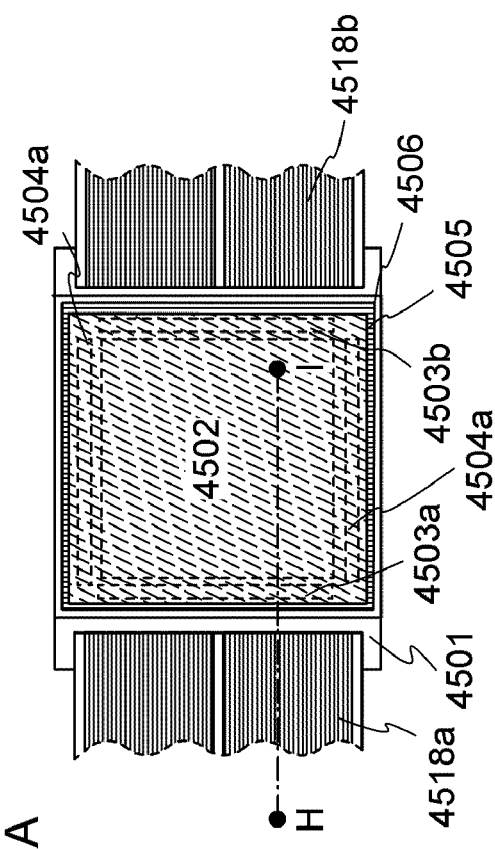
FIGS. 18A and 18B are a top view and a cross-sectional view, respectively, illustrating a semiconductor device.
Figure 18B:
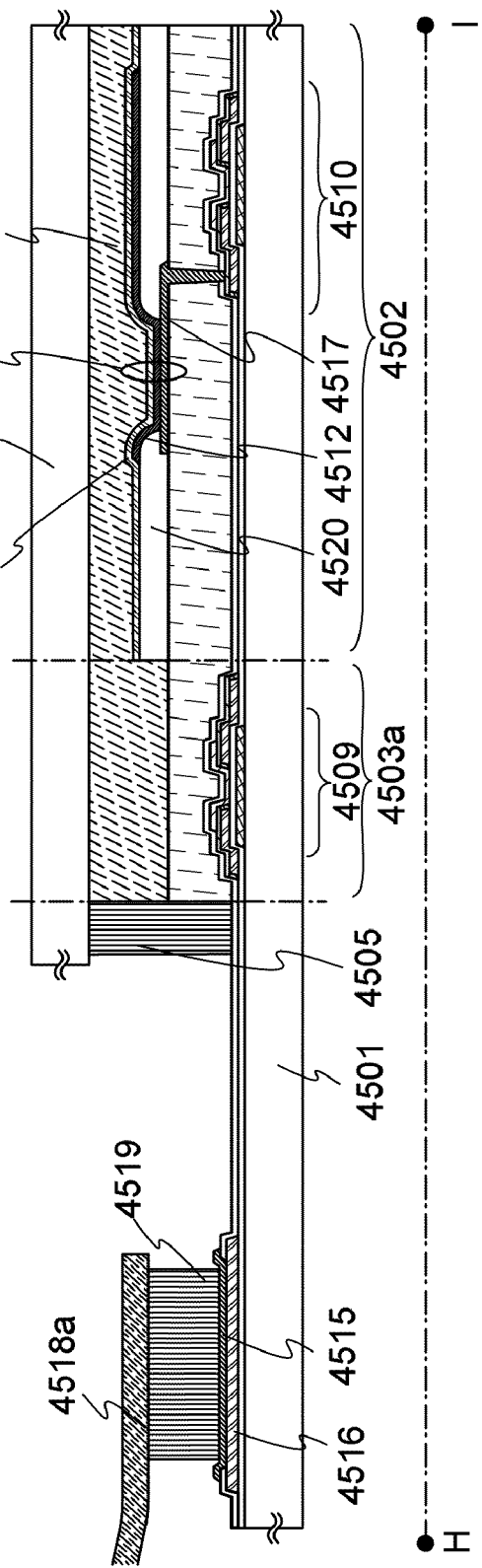

Next, the appearance and a cross section of a light-emitting display panel (also referred to as a light-emitting panel), which is one mode of the semiconductor device according to an embodiment of the present invention, will be described with reference to FIGS. 18A and 18B. FIG. 18A is a top view of a panel in which thin film transistors with high electric characteristics, in each of which second conductive layers formed using a high-melting-point metal material or barrier layers including aluminum oxide as a main component are provided between an oxide semiconductor layer including indium, gallium, and zinc and first conductive layers including aluminum as a main component in order to suppress diffusion of aluminum atoms to the oxide semiconductor layer, and a light-emitting element are sealed between a first substrate and a second substrate with a sealant. FIG. 18B is a cross-sectional view taken along line H-I of FIG. 18A.

A sealant 4505 is provided to surround a pixel portion 4502, signal line driver circuits 4503a and 4503b, and scanning line driver circuits 4504a and 4504b, which are provided over a first substrate 4501. In addition, a second substrate 4506 is provided over the pixel portion 4502, the signal line driver circuits 4503a and 4503b, and the scanning line driver circuits 4504a and 4504b. Accordingly, the pixel portion 4502, the signal line driver circuits 4503a and 4503b, and the scanning line driver circuits 4504a and 4504b are sealed together with a filler 4507, by the first substrate 4501, the sealant 4505, and the second substrate 4506. It is preferable that a display device be thus packaged (sealed) with a protective film (such as a bonding film or an ultraviolet curable resin film) or a cover material with high air-tightness and little degasification so that the display device is not exposed to the outside air.

The pixel portion 4502, the signal line driver circuits 4503a and 4503b, and the scanning line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 18B.

Each of the thin film transistors 4509 and 4510 is a thin film transistor with high electric characteristics, in which second conductive layers formed using a high-melting-point metal material or barrier layers including aluminum oxide as a main component are provided between an oxide semiconductor layer including indium, gallium, and zinc and first conductive layers including aluminum as a main component in order to suppress diffusion of aluminum atoms to the oxide semiconductor layer, and any of the thin film transistors described in Embodiments 1 and 2 can be used as the thin film transistors 4509 and 4510. In this embodiment, the thin film transistors 4509 and 4510 are n-channel thin film transistors.

Moreover, reference numeral 4511 denotes a light-emitting element. A first electrode layer 4517 that is a pixel electrode included in the light-emitting element 4511 is electrically connected to a source electrode layer or a drain electrode layer of the thin film transistor 4510. Note that a structure of the light-emitting element 4511 is not limited to the stacked structure shown in this embodiment, which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with continuous curvature.

The electroluminescent layer 4512 may be formed using a single layer or a plurality of layers stacked.

A protective film may be formed over the second electrode layer 4513 and the partition wall 4520 in order to prevent oxygen, hydrogen, moisture, carbon dioxide, or the like from entering the light-emitting element 4511. As the protective film, a silicon nitride film, a silicon nitride oxide film, a DLC film, or the like can be formed.

A variety of signals and potentials are supplied to the signal line driver circuits 4503a and 4503b, the scanning line driver circuits 4504a and 4504b, or the pixel portion 4502 from FPCs 4518a and 4518b.

In this embodiment, a connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal of the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment, nitrogen is used for the filler 4507.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scanning line driver circuits or part thereof may be separately formed and mounted. This embodiment is not limited to the structure illustrated in FIGS. 18A and 18B.

In the thin film transistor described in Embodiment 1 or 2, the second conductive layers formed using a high-melting-point metal material or the barrier layers including aluminum oxide as a main component are provided between the oxide semiconductor layer including indium, gallium, and zinc and the first conductive layers including aluminum as a main component in order to suppress diffusion of aluminum atoms to the oxide semiconductor layer; thus, the thin film transistor has high reliability. By mounting a reliable thin film transistor in which diffusion of aluminum atoms to the oxide semiconductor layer is suppressed, a highly reliable display device can be manufactured. This embodiment can be implemented in combination with any of the structures described in other embodiments, as appropriate.

Embodiment 7

A display device of one embodiment of the present invention can be applied to electronic paper. Electronic paper can be used for electronic appliances of a variety of fields as long as they can display data. For example, electronic paper can be applied to an e-book reader (electronic book), a poster, an advertisement in a vehicle such as a train, or displays of various cards such as a credit card. Examples of the electronic appliances are illustrated in FIGS. 19A and 19B and FIG. 20.

Figure 19A:
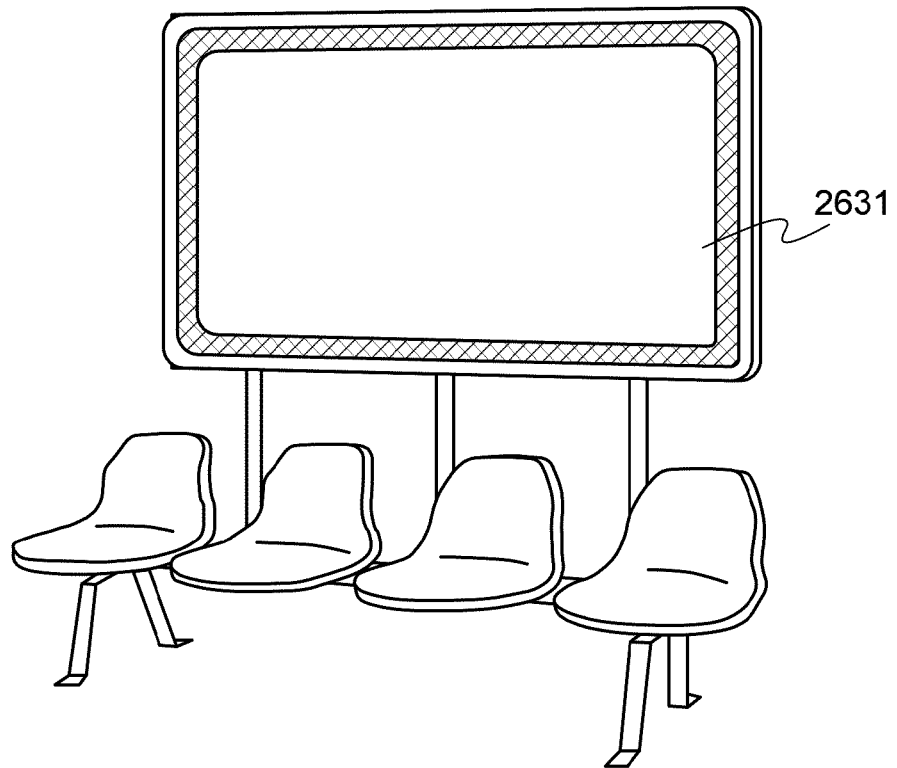
FIGS. 19A and 19B illustrate examples of an application mode of electronic paper.

FIG. 19A illustrates a poster 2631 using electronic paper. In the case where an advertising medium is printed paper, the advertisement is replaced by hands; however, by using electronic paper to which an embodiment of the present invention is applied, the advertising display can be changed in a short time. Furthermore, stable images can be obtained without display defects. Note that the poster may have a configuration capable of wirelessly transmitting and receiving data.

Figure 19B:
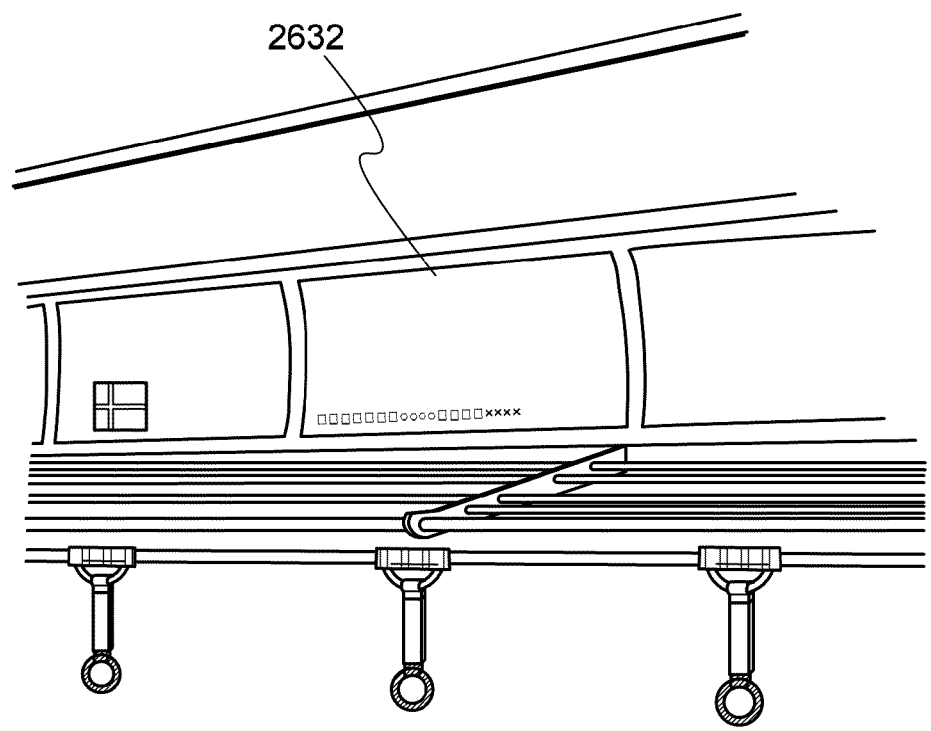

FIG. 19B illustrates an advertisement 2632 in a vehicle such as a train. In the case where an advertising medium is printed paper, the advertisement is replaced by hands; however, by using electronic paper to which an embodiment of the present invention is applied, the advertising display can be changed in a short time with less manpower. Furthermore, stable images can be obtained without display defects. Note that the advertisement in a vehicle may have a configuration capable of wirelessly transmitting and receiving data.

Figure 20:
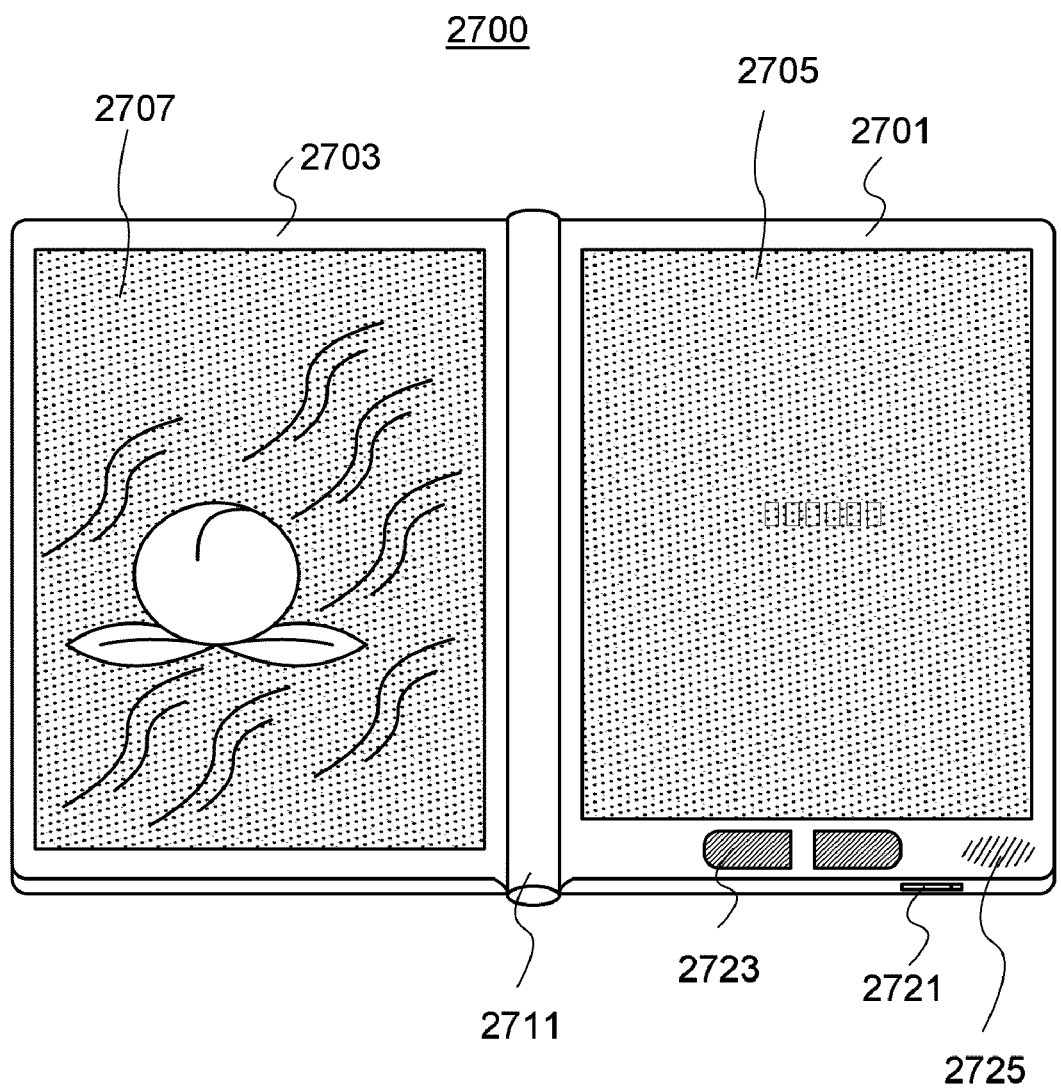
FIG. 20 is an exterior view illustrating an example of an e-book reader.

FIG. 20 illustrates an example of an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 20) and graphics can be displayed on a display portion on the left side (the display portion 2707 in FIG. 20).

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

In the thin film transistor described in Embodiment 1 or 2, the second conductive layers formed using a high-melting-point metal material or the barrier layers including aluminum oxide as a main component are provided between the oxide semiconductor layer including indium, gallium, and zinc and the first conductive layers including aluminum as a main component in order to suppress diffusion of aluminum atoms to the oxide semiconductor layer; thus, the thin film transistor has high reliability. By mounting a reliable thin film transistor in which diffusion of aluminum atoms to the oxide semiconductor layer is suppressed, a highly reliable display device can be manufactured.

Embodiment 8

A semiconductor device according to an embodiment of the present invention can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio reproducing device, a large-sized game machine such as a pachinko machine, and the like.

Figure 21A:
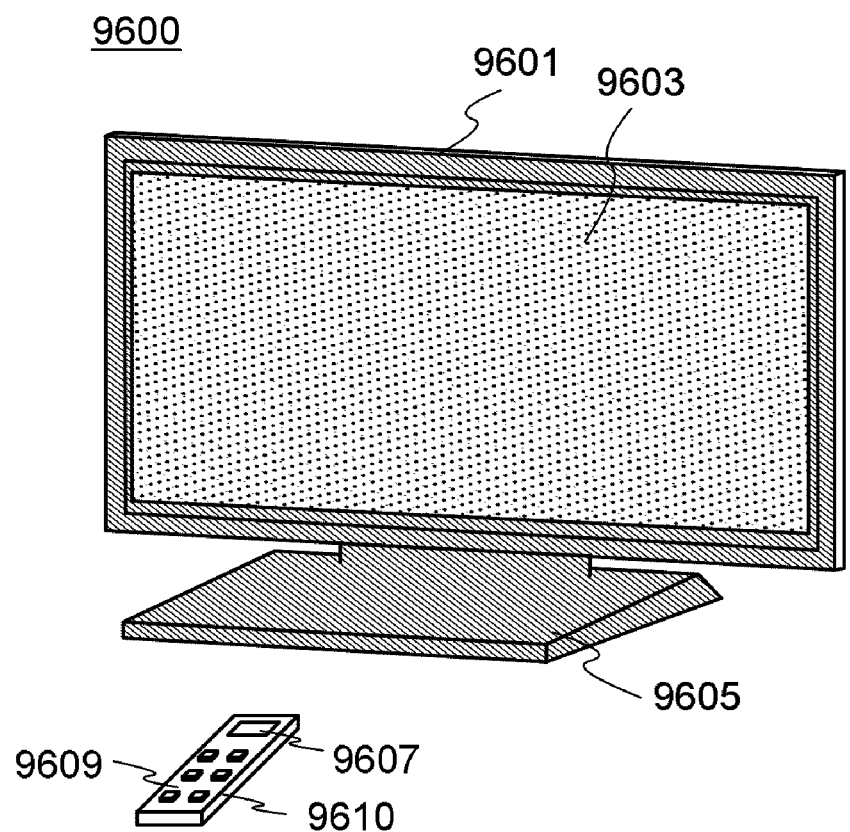
FIGS. 21A and 21B are exterior views illustrating examples of a television device and a digital photo frame.

FIG. 21A illustrates an example of a television set 9600. In the television set 9600, a display portion 9603 is incorporated in a housing 9601. Images can be displayed on the display portion 9603. Here, the housing 9601 is supported by a stand 9605.

The television set 9600 can be operated by an operation switch of the housing 9601 or a separate remote controller 9610. Channels and volume can be controlled by an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Figure 21B:
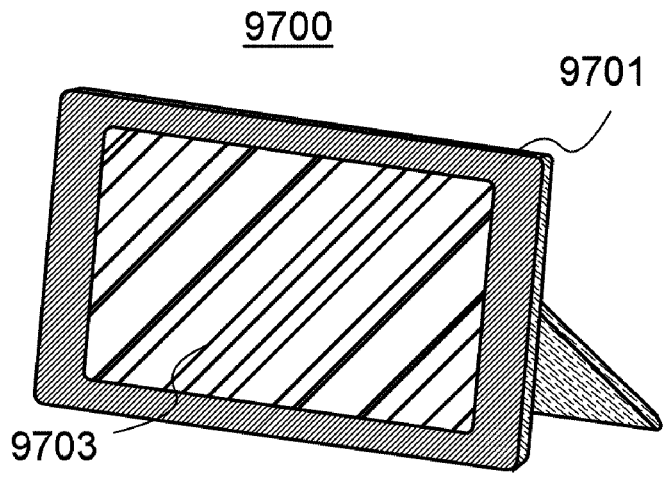

FIG. 21B illustrates an example of a digital photo frame 9700. For example, in the digital photo frame 9700, a display portion 9703 is incorporated in a housing 9701. Various images can be displayed on the display portion 9703. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the same surface as the display portion, it is preferable to provide them on the side surface or the back surface for the design of the digital photo frame 9700. For example, a memory storing data of an image shot by a digital camera is inserted in the recording medium insertion portion of the digital photo frame, whereby the image data can be downloaded and displayed on the display portion 9703.

The digital photo frame 9700 may have a configuration capable of wirelessly transmitting and receiving data. Through wireless communication, desired image data can be downloaded to be displayed.

Figure 22A:
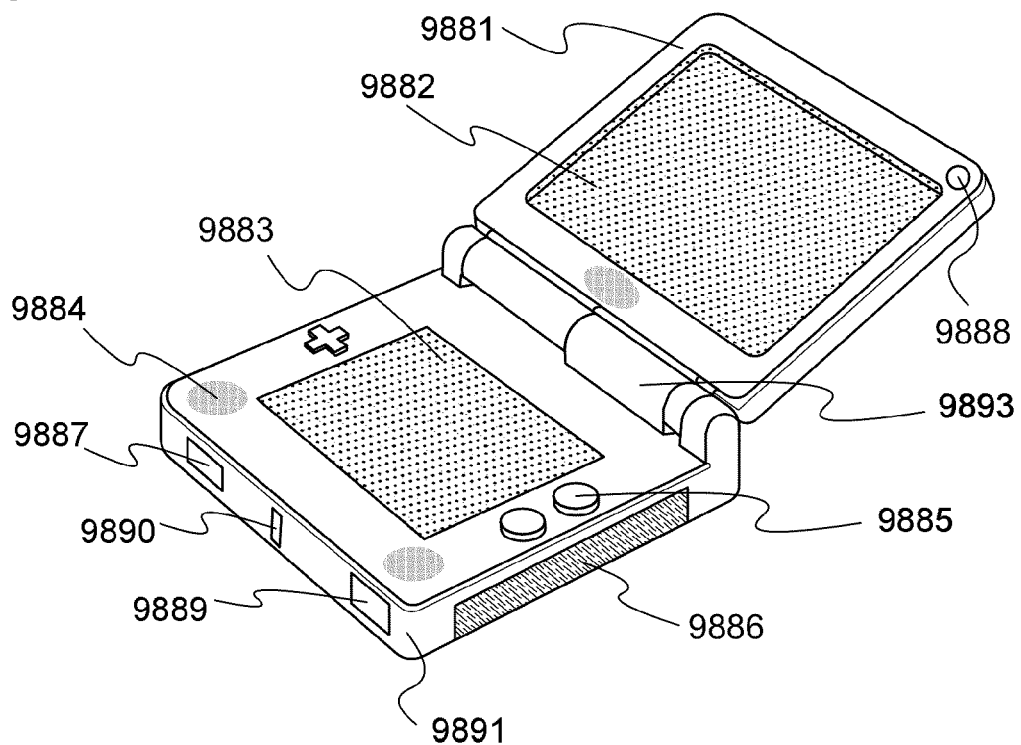
FIGS. 22A and 22B are exterior views illustrating examples of an amusement machine.

FIG. 22A is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 22A includes a speaker portion 9884, a recording medium insertion portion 9886, an LED lamp 9890, an input means (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a semiconductor device according to an embodiment of the present invention may be employed. The portable amusement machine may include other accessory equipment as appropriate. The portable amusement machine illustrated in FIG. 22A has a function of reading a program or data stored in a recording medium to display it on the display portion, and a function of sharing information with another portable amusement machine by wireless communication. The portable amusement machine illustrated in FIG. 22A can have various functions without limitation to the above.

Figure 22B:
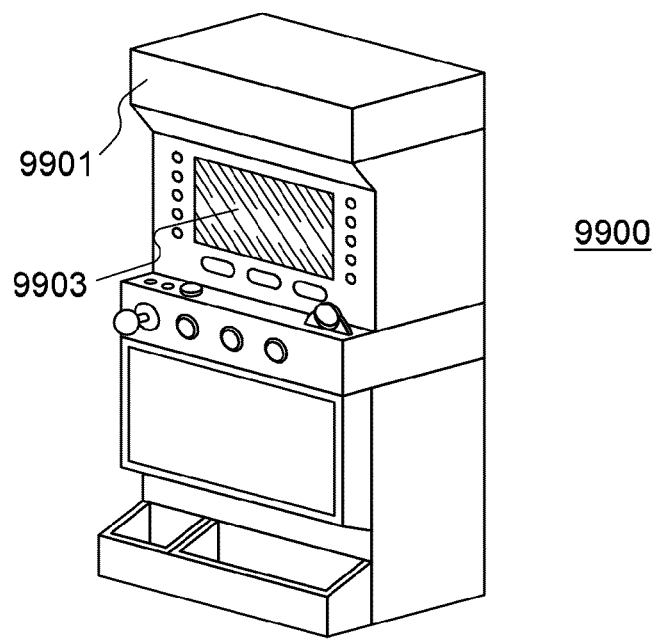

FIG. 22B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device according to an embodiment of the present invention may be employed. The slot machine 9900 may include other accessory equipment as appropriate.

Figure 23:
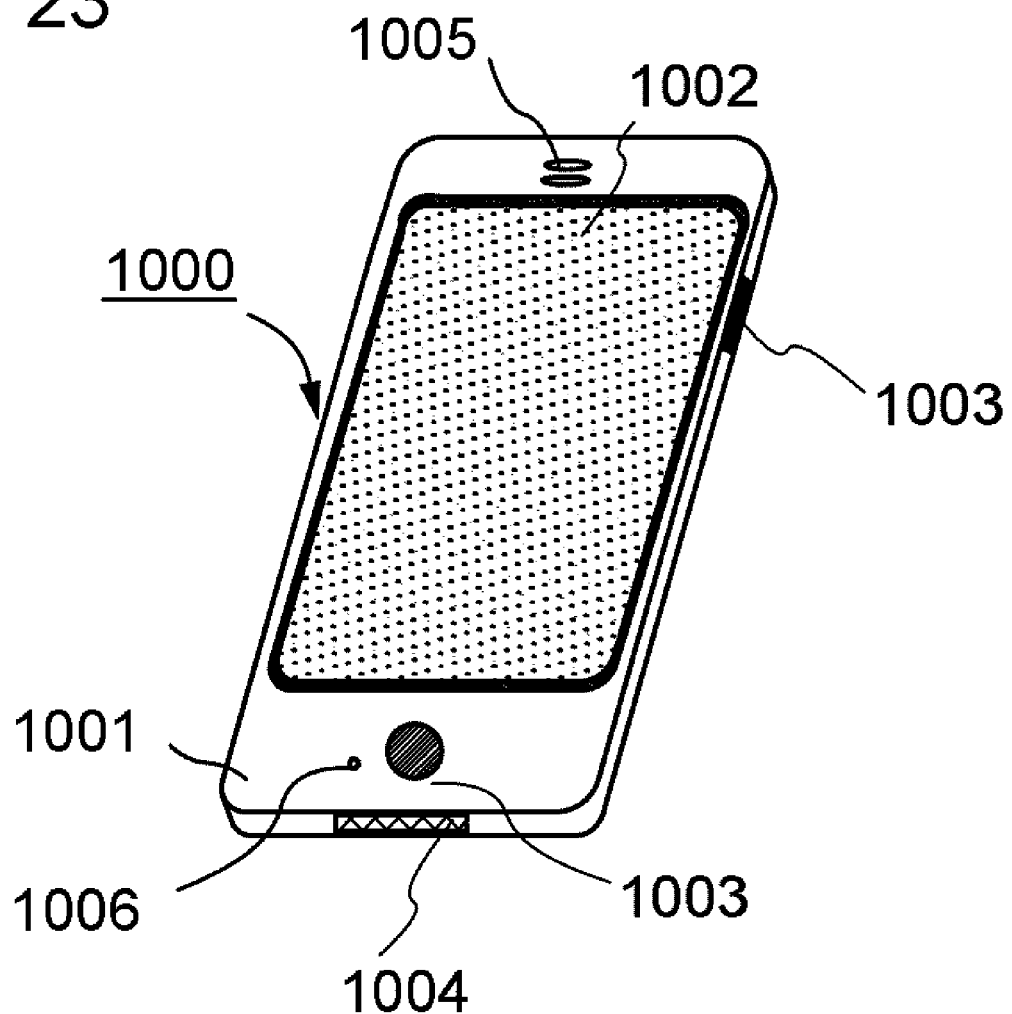
FIG. 23 is an exterior view illustrating an example of a cellular phone.

FIG. 23 illustrates an example of a cellular phone 1000. The cellular phone 1000 is provided with a display portion 1002 incorporated in a housing 1001, operation buttons 1003, an external connection port 1004, a speaker 1005, a microphone 1006, and the like.

When the display portion 1002 of the cellular phone 1000 illustrated in FIG. 23 is touched with a finger or the like, data can be input into the mobile phone 1000. Furthermore, operations such as making calls and composing mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In that case, it is preferable to display a keyboard or number buttons on almost all the area of the screen of the display portion 1002.

When a detection device including a sensor for detecting inclination, such as a gyroscope or an acceleration sensor, is provided inside the cellular phone 1000, display on the screen of the display portion 1002 can be automatically switched by determining the direction of the cellular phone 1000 (whether the cellular phone 1000 is placed horizontally or vertically for a landscape mode or a portrait mode).

The screen mode is switched by touching the display portion 1002 or operating the operation buttons 1003 of the housing 1001. Alternatively, the screen mode may be switched depending on the kind of images displayed on the display portion 1002. For example, when a signal of an image displayed on the display portion is of moving image data, the screen mode is switched to the display mode. When the signal is of text data, the screen mode is switched to the input mode.

Furthermore, in the input mode, when input by touching the display portion 1002 is not performed for a certain period after a signal is detected by the optical sensor in the display portion 1002, the screen mode may be controlled so as to be switched from the input mode to the display mode.

The display portion 1002 may function as an image sensor. For example, an image of a palm print, a fingerprint, or the like is taken by touching the display portion 1002 with the palm or the finger, whereby personal authentication can be performed. Furthermore, by providing a backlight or sensing light source emitting a near-infrared light for the display portion, an image of a finger vein, a palm vein, or the like can also be taken.

In the thin film transistor described in Embodiment 1 or 2, the second conductive layers formed using a high-melting-point metal material or the barrier layers including aluminum oxide as a main component are provided between the oxide semiconductor layer including indium, gallium, and zinc and the first conductive layers including aluminum as a main component in order to suppress diffusion of aluminum atoms to the oxide semiconductor layer; thus, the thin film transistor has high reliability. By mounting a reliable thin film transistor in which diffusion of aluminum atoms to the oxide semiconductor layer is suppressed, a highly reliable electronic appliance can be manufactured.

This application is based on Japanese Patent Application serial No. 2008-264497 filed with Japan Patent Office on Oct. 10, 2008, the entire contents of which are hereby incorporated by reference.

What is claimed is:

1. A semiconductor device comprising:
   an oxide semiconductor layer including indium and zinc;
   a first conductive layer including aluminum;
   a second conductive layer including a high-melting-point metal material over the first conductive layer; and
   a barrier layer including aluminum oxide,
   wherein the barrier layer has a thickness of greater than 0 nm and less than or equal to 5 nm,
   wherein the barrier layer is formed in an edge portion of the first conductive layer, and
   wherein the oxide semiconductor layer is provided in contact with the second conductive layer and the barrier layer.

2. The semiconductor device according to claim 1, wherein the high-melting-point metal material includes at least one selected from the group consisting of titanium, tantalum, tungsten, molybdenum, chromium, neodymium, and scandium.

3. The semiconductor device according to claim 1, wherein the semiconductor device is one selected from the group consisting of an e-book, a television set, a digital photo frame, a portable amusement machine, a slot machine, and a phone.

4. A semiconductor device comprising:
   a gate insulating layer;
   a gate electrode layer provided on one side of the gate insulating layer;
   an oxide semiconductor layer provided on the other side of the gate insulating layer; and
   a source electrode layer and a drain electrode layer, each comprising a first conductive layer including aluminum in contact with the gate insulating layer, a second conductive layer including a high-melting-point metal material over the first conductive layer, and a barrier layer including aluminum oxide at an edge portion of the first conductive layer,
   wherein the barrier layer has a thickness of greater than 0 nm and less than or equal to 5 nm, and
   wherein the oxide semiconductor layer is in contact with the second conductive layer and the barrier layer.

5. The semiconductor device according to claim 4, wherein the high-melting-point metal material includes at least one selected from the group consisting of titanium, tantalum, tungsten, molybdenum, chromium, neodymium, and scandium.

6. The semiconductor device according to claim 4, wherein the semiconductor device is one selected from the group consisting of an e-book, a television set, a digital photo frame, a portable amusement machine, a slot machine, and a phone.

7. A semiconductor device comprising:
   a source electrode layer and a drain electrode layer, each comprising a first conductive layer including aluminum, a second conductive layer including a high-melting-point metal material over the first conductive layer, and a barrier layer including aluminum oxide at an edge portion of the first conductive layer;
   an oxide semiconductor layer covering end portions of the source electrode layer and the drain electrode layer;
   a gate insulating layer covering the oxide semiconductor layer; and
   a gate electrode layer overlapping the end portions of the source electrode layer and the drain electrode layer with the oxide semiconductor layer and the gate insulating layer interposed therebetween,
   wherein the oxide semiconductor layer is in contact with the second conductive layer and the barrier layer.

8. The semiconductor device according to claim 7, wherein the barrier layer including aluminum oxide has a thickness of greater than 0 nm and less than or equal to 5 nm.

9. The semiconductor device according to claim 7, wherein the high-melting-point metal material includes at least one selected from the group consisting of titanium, tantalum, tungsten, molybdenum, chromium, neodymium, and scandium.

10. The semiconductor device according to claim 7, wherein the semiconductor device is one selected from the group consisting of an e-book, a television set, a digital photo frame, a portable amusement machine, a slot machine, and a phone.

11. A manufacturing method of a thin film transistor, comprising:
    forming a source electrode layer and a drain electrode layer, each comprising a first conductive layer including aluminum, and a second conductive layer including a high-melting-point metal material over the first conductive layer;
    forming a barrier layer including aluminum oxide by performing an oxidation treatment on an exposed edge portion of the first conductive layer, wherein the barrier layer has a thickness of greater than 0 nm and less than or equal to 5 nm; and
    stacking an oxide semiconductor layer including indium and zinc so that the oxide semiconductor layer is in contact with the second conductive layer and the barrier layer.

12. The manufacturing method of a thin film transistor according to claim 11, wherein the high-melting-point metal material includes at least one selected from the group consisting of titanium, tantalum, tungsten, molybdenum, chromium, neodymium, and scandium.

13. The manufacturing method of a thin film transistor according to claim 11, wherein the thin film transistor is incorporated in one selected from the group consisting of an e-book, a television set, a digital photo frame, a portable amusement machine, a slot machine, and a phone.

14. A semiconductor device comprising:
    a gate insulating layer;
    a gate electrode layer provided adjacent to the gate insulating layer;
    an oxide semiconductor layer provided adjacent to the gate insulating layer; and
    a source electrode layer and a drain electrode layer, each comprising a first conductive layer including aluminum in contact with the gate insulating layer, a second conductive layer including a high-melting-point metal material over the first conductive layer, and a barrier layer including aluminum oxide at an edge portion of the first conductive layer,
    wherein the barrier layer has a thickness of greater than 0 nm and less than or equal to 5 nm, and
    wherein the oxide semiconductor layer is in contact with the second conductive layer and the barrier layer.

15. The semiconductor device according to claim 14, wherein the high-melting-point metal material includes at least one selected from the group consisting of titanium, tantalum, tungsten, molybdenum, chromium, neodymium, and scandium.

16. The semiconductor device according to claim 14, wherein the semiconductor device is one selected from the group consisting of an e-book, a television set, a digital photo frame, a portable amusement machine, a slot machine, and a phone.

* * * * *